(12) United States Patent
Mori

(10) Patent No.: US 9,484,394 B2
(45) Date of Patent: Nov. 1, 2016

(54) DISPLAY DEVICE AND ELECTRONIC APPARATUS

(71) Applicant: JOLED Inc., Tokyo (JP)

(72) Inventor: Tsutomu Mori, Kanagawa (JP)

(73) Assignee: JOLED Inc., Tokyo (JP)

( * ) Notice: Subject to any disclaimer, the term of this patent is extended or adjusted under 35 U.S.C. 154(b) by 0 days.

(21) Appl. No.: 14/626,145

(22) Filed: Feb. 19, 2015

(65) Prior Publication Data

US 2015/0255743 A1 Sep. 10, 2015

(30) Foreign Application Priority Data

Mar. 7, 2014 (JP) ................................. 2014-044807

(51) Int. Cl.
*H01L 27/32* (2006.01)
*H01L 51/52* (2006.01)

(52) U.S. Cl.
CPC ......... *H01L 27/326* (2013.01); *H01L 27/3246* (2013.01); *H01L 27/3276* (2013.01); *H01L 51/524* (2013.01); *H01L 2227/323* (2013.01)

(58) Field of Classification Search
CPC ........... H01L 51/0545; H01L 51/0036; H01L 51/0541; H01L 51/5012

USPC .......................................... 257/40, 433, 443
See application file for complete search history.

(56) References Cited

U.S. PATENT DOCUMENTS 7,109,655 B2 * 9/2006 Kurihara ............. H01L 51/5237
313/504
2013/0234121 A1 * 9/2013 Sonoyama .......... H01L 51/5012
257/40

FOREIGN PATENT DOCUMENTS

JP 2008-000678 A 1/2008
JP 2009-266766 A 11/2009

* cited by examiner

*Primary Examiner* — Quoc Hoang
(74) *Attorney, Agent, or Firm* — Michael Best & Friedrich LLP

(57) ABSTRACT

A display device includes a first substrate including an organic layer forming region, and an organic layer non-forming region which is provided on an outer side of the organic layer forming region; and a first partitioning wall which is provided between the organic layer forming region and the organic layer non-forming region on the first substrate.

22 Claims, 31 Drawing Sheets

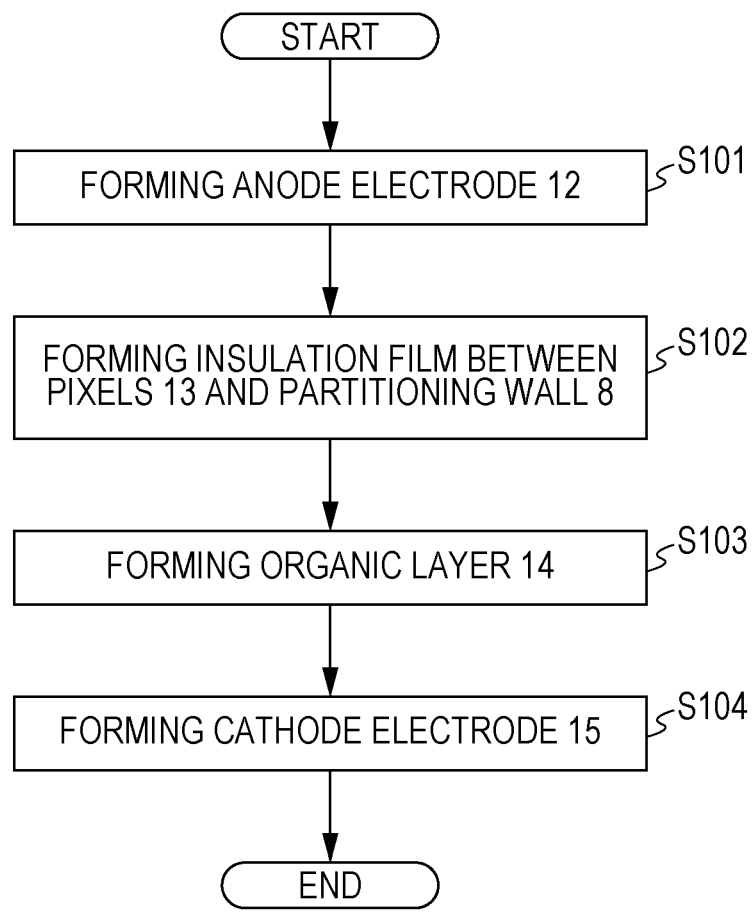

DISPLAY DEVICE AND ELECTRONIC APPARATUS

CROSS REFERENCE TO RELATED APPLICATIONS

This application claims the benefit of Japanese Priority Patent Application JP 2014-044807 filed Mar. 7, 2014, the entire contents of which are incorporated herein by reference.

BACKGROUND

The present technology relates to a display device which includes an organic layer, and an electronic apparatus.

A display device includes a plurality of layers such as a wiring layer, a light emitting layer, an insulation layer, and the like, between a pair of substrates. Each layer of the display device is configured of an organic material, an inorganic material, or the like.

An organic layer including a light emitting layer is provided in a pixel region on a substrate, in an organic electroluminescence (EL) display device. A terminal for connection to the outside, or the like, is arranged in a peripheral region of the outer side of a pixel region. The region in which the terminal, or the like, is provided is an organic layer non-forming region, and when an organic material is attached to the organic layer non-forming region, there is a concern that a yield, reliability, and the like, of the display device may deteriorate. Accordingly, it is necessary to prevent attaching of an organic material to the organic layer non-forming region in a manufacturing process of the display device (for example, Japanese Unexamined Patent Application Publication Nos. 2009-266766 and 2008-678).

Meanwhile, as a method of performing film formation of an organic material, a printing method is gaining attention. As the printing method, for example, there is an ink jet printing method, a slit printing method, a stripe printing method, a nozzle printing method, or the like.

SUMMARY

However, when an organic layer is formed in a pixel region using a printing method, there is a concern that an organic material may easily flow also in an organic layer non-forming region, and a yield, reliability, or the like, may deteriorate.

It is desirable to provide a display device in which attaching of an organic material to an organic layer non-forming region is prevented, and an electronic apparatus.

According to an embodiment of the present technology, there is provided a display device which includes a first substrate including an organic layer forming region, and an organic layer non-forming region which is provided on an outer side of the organic layer forming region, and a first partitioning wall which is provided between the organic layer forming region and the organic layer non-forming region on the first substrate.

According to another embodiment of the present technology, there is provided an electronic apparatus which includes the display device.

In the display device and the electronic apparatus according to the present technology, an organic material which is subjected to film formation in the organic layer forming region is blocked due to a first partitioning wall of a first substrate, and stays in the inside of an organic layer non-forming region.

In the display device and the electronic apparatus according to the present technology, it is possible to prevent flowing in of an organic material from the organic layer forming region to the organic layer non-forming region since the first partitioning wall is provided on the first substrate. Accordingly, it is possible to prevent attaching of the organic material to the organic layer non-forming region. In addition, the effect which is described here is not necessarily limited, and may be any one of effects which are described in the present disclosure.

BRIEF DESCRIPTION OF THE DRAWINGS

FIG. 11 is a diagram which illustrates an example of a manufacturing process of the display device which is illustrated in FIG. 1;

FIG. 25 is a plan view which illustrates a schematic configuration of a module including the display device illustrated in FIG. 1, or the like;

DETAILED DESCRIPTION OF EMBODIMENTS

Hereinafter, embodiments of the present technology will be described with reference to drawings. In addition, descriptions will be made in the following order.
1. First Embodiment (display device: example including terminal region as organic layer non-forming region)
2. Modification Example 1 (example including sealing region as organic layer non-forming region)
3. Modification Example 2 (example including connection region as organic layer non-forming region)
4. Modification Examples 3 to 6 (examples including plurality of organic layer non-forming regions)
5. Second Embodiment (display device: example including liquid repellant region)
6. Application Example First Embodiment Entire Configuration of Display Device 1

Figure 1:
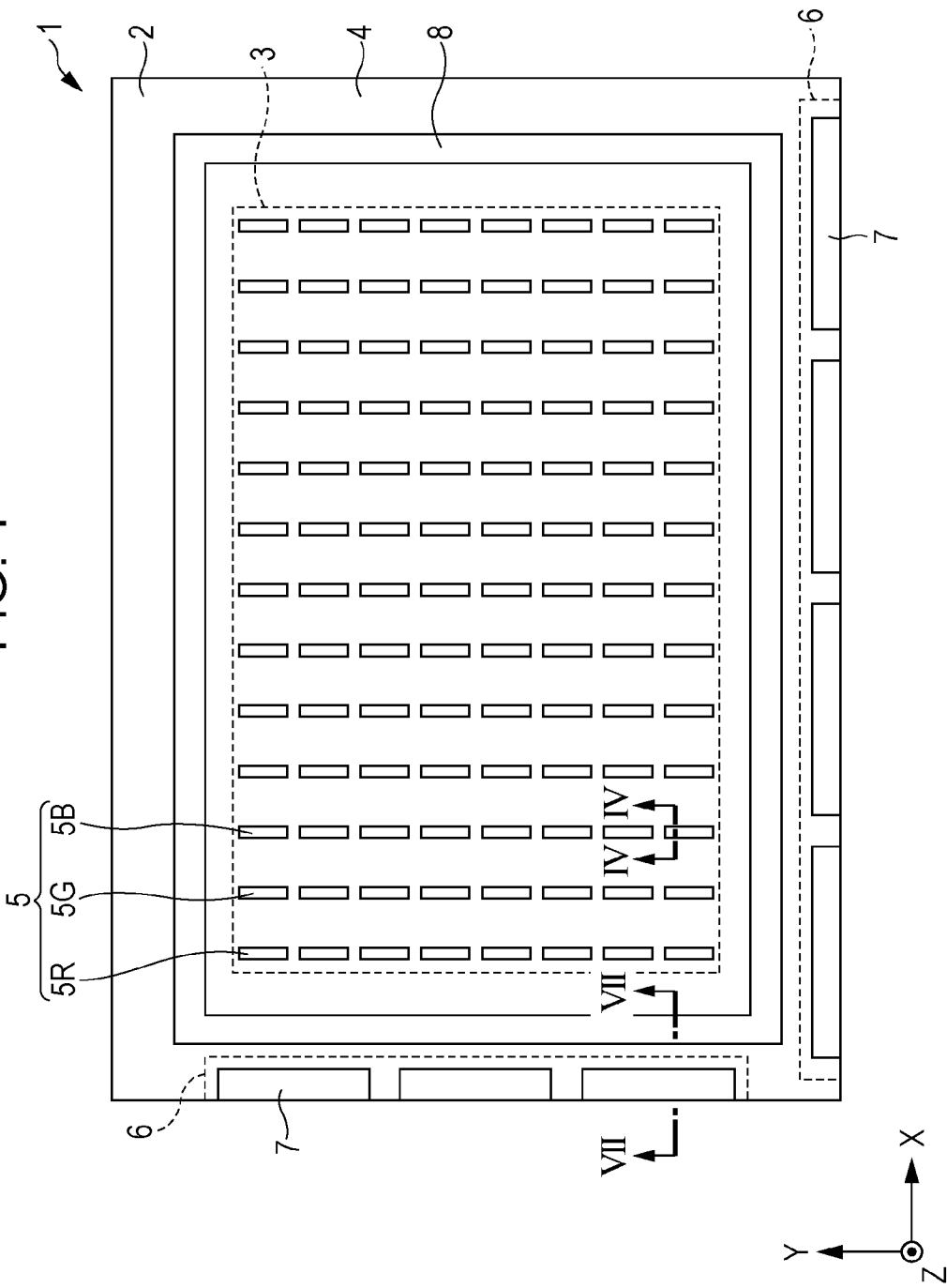
FIG. 1 is a plan view which illustrates a configuration of a display device according to a first embodiment of the present technology.

FIG. 1 is a diagram which schematically illustrates a planar configuration of an organic EL display device (display device 1) according to a first embodiment of the present technology. The display device 1 includes a substrate 2 (first substrate), a pixel region 3 is provided at a center portion of the substrate 2, and a peripheral region 4 is provided on the outer side of the pixel region 3.

The pixel region 3 is a rectangular region in which a plurality of pixels 5 are arranged in a matrix. The plurality of pixels 5 are configured of a red pixel 5R, a green pixel 5G, and a blue pixel 5B, for example. For example, organic EL elements (organic EL element 10 in FIG. 4 which will be described later) of a respective corresponding color are provided in each pixel 5 (red pixel 5R, green pixel 5G, and blue pixel 5B). Each of the red pixel 5R, the green pixel 5G, and the blue pixel 5B configures a sub-pixel, and a combination of a neighboring red pixel 5R, green pixel 5G, and blue pixel 5B configures one display pixel. In addition, the pixel region 3 here includes a so-called effective area in which an image is actually displayed, and a dummy pixel on the outer side thereof. A terminal region 6 is provided at an end portion of the peripheral region 4. A terminal 7 for an external connection is arranged in the terminal region 6, and the terminal 7 is electrically connected to a driver IC, or the like, for example.

Figure 2:
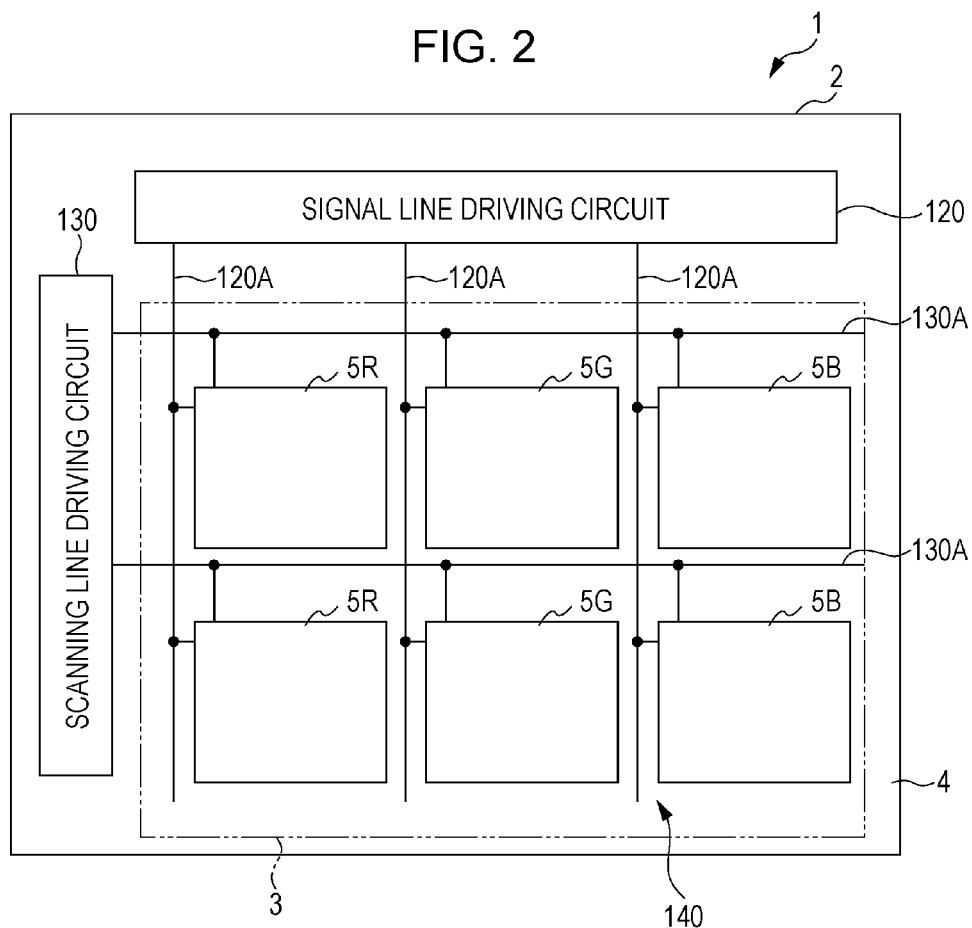
FIG. 2 is a diagram which illustrates the entire configuration of the display device which is illustrated in FIG. 1.

FIG. 2 illustrates the entire configuration of the display device 1. The driver IC which is electrically connected to the terminal 7 is a signal line driving circuit 120 and a scanning line driving circuit 130 which are drivers for image displaying, for example. Signals from the signal line driving circuit 120 and the scanning line driving circuit 130 are transmitted to each pixel 5 in the pixel region 3 through the terminal 7. A pixel driving circuit 140 is provided in the pixel region 3.

Figure 3:
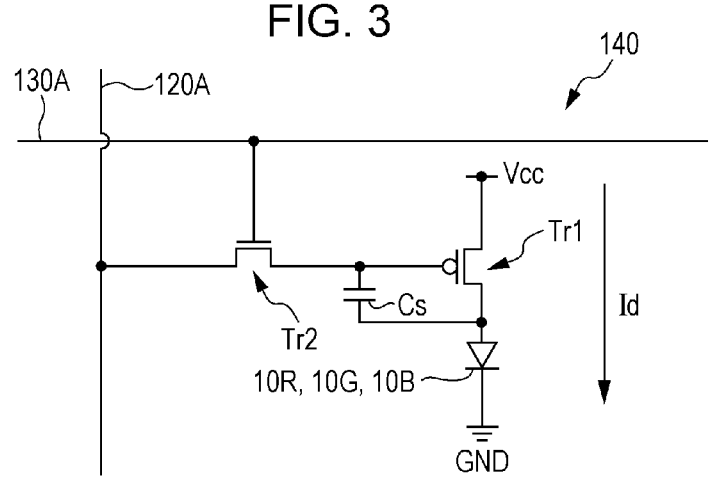
FIG. 3 is a diagram which illustrates an example of a pixel driving circuit which is illustrated in FIG. 2.

FIG. 3 illustrates an example of the pixel driving circuit 140. The pixel driving circuit 140 is an active driving circuit, for example. Specifically, in the pixel driving circuit 140, a driving transistor Tr1, a writing transistor Tr2, a capacitor (storage capacitor) Cs between the transistors Tr1 and Tr2, and organic EL elements (red organic EL element 10R, green organic EL element 10G, and blue organic EL element 10B in FIG. 5 which will be described later) which are connected to the driving transistor Tr1 in series between a first power line (Vcc) and a second power line (GND) are provided. An anode electrode (anode electrode 12 in FIG. 4 which will be described later) of the organic EL element is connected to a source electrode of the driving transistor Tr1, and a cathode electrode (cathode electrode 15 in FIG. 4 which will be described later) of the organic EL element is connected to a common power supply line (GND). The driving transistor Tr1 and the writing transistor Tr2 are configured of a general thin film transistor (TFT), and the configuration may be an inverse stagger structure (so-called bottom gate type), for example, may be a stagger structure (top gate type), and is not particularly limited.

In the pixel driving circuit 140, a plurality of signal lines 120A are arranged in the column direction, and a plurality of scanning lines 130A are arranged in the row direction. An intersection point of each signal line 120A and each scanning line 130A corresponds to any one of the red pixel 5R, the green pixel 5G, and the blue pixel 5B. Each signal line 120A is connected to the signal line driving circuit 120, and an image signal is supplied to the source electrode of the writing transistor Tr2 through the signal line 120A from the signal line driving circuit 120. Each scanning line 130A is connected to the scanning line driving circuit 130, and scanning signals are sequentially supplied to the gate electrode of the writing transistor Tr2 through the scanning line 130A from the scanning line driving circuit 130.

Configuration of Main Parts of Display Device 1

Figure 4:
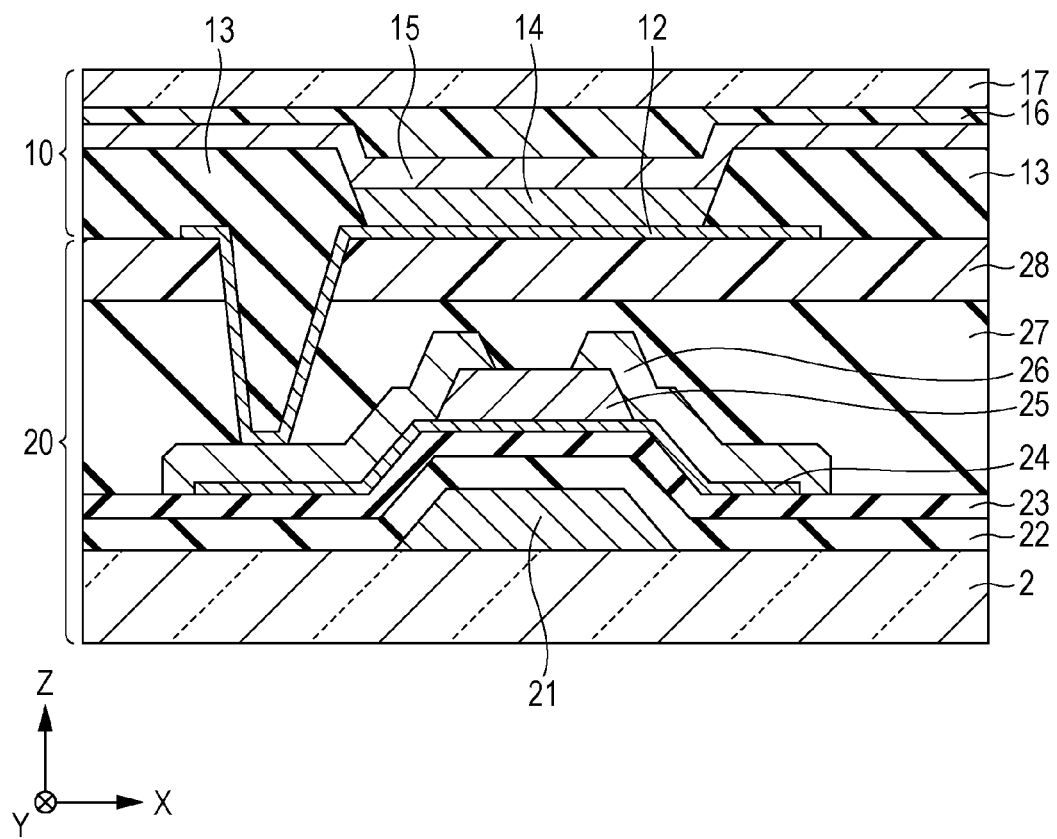
FIG. 4 is a diagram which illustrates a configuration in a cross section which is taken along line IV-IV illustrated in FIG. 1.

FIG. 4 is a cross-sectional view which illustrates a detailed configuration of the pixel region 3, and illustrates a configuration in a cross section which is taken along line IV-IV in FIG. 1. A TFT 20, and the organic EL element 10 are provided in the pixel region 3 on the substrate 2. The red pixel 5R is configured of the red organic EL element (red organic EL element 10R in FIG. 5 which will be described later) which generates red light, the green pixel 5G is configured of the green organic EL element (green organic EL element 10G in FIG. 5 which will be described later) which generates green light, and the blue pixel 5B is configured of the blue organic EL element (blue organic EL element 10B in FIG. 5 which will be described later) which generates blue light, respectively. The TFT 20 and the organic EL element 10 are provided between the substrate 2 and the sealing substrate 17 (second substrate), and the organic EL element 10 and the sealing substrate 17 are filled with a filling layer 16 therebetween. The display device 1 is a top emission-type display device, for example, and light which is generated in the organic EL element 10 is taken out from the sealing substrate 17.

The substrate 2 is formed using glass, a plastic material, or the like, which blocks off transmittance of moisture (vapor) and oxygen, or the like, for example. The substrate 2 is a support body in which a plurality of pixels 5 are formed by being arranged on one main face thereof. As a configuration material of the substrate 2, for example, there is a glass substrate such as glass with a high strain point, soda glass ($Na_2O.CaO.SiO_2$), borosilicate glass ($Na_2O.B_2O_3.SiO_2$), forsterite ($2MgO.SiO_2$), and lead glass ($Na_2O.PbO.SiO_2$), a quartz substrate, or a silicon substrate. The substrate 2 may be configured by providing an insulation film on the surface of such a glass substrate, quartz substrate, and silicon substrate. It is also possible to use metallic foil, a resin film or sheet, or the like, in the substrate 2. As a material of the resin, for example, there is an organic polymer such as polymethyl methacrylate (Polymethylmethacrylate, PMMA), polyvinyl alcohol (PVA), polyvinyl phenyl (PVP), polyethersulfone (PES), polyimide, polycarbonate, polyethylene-terephthalate (PET), and polyethylene naphthalate (PEN). In addition, since light is taken out from the sealing substrate 17 which will be described later in the top emission type, the substrate 2 may be formed of either one of a permeable material and a non-permeable material. The same material as that of the substrate 2 may be used, or a different material may be used in the sealing substrate 17. In addition, the substrate 2 may be configured of a flexible material.

The TFT 20 is a driving element which drives the organic EL element 10 using an active matrix method, for example. For example, the TFT 20 is the driving transistor Tr1 or the writing transistor Tr2 which configure the pixel driving circuit 140. The TFT 20 is, for example, a bottom gate-type TFT, in which, for example, an oxide semiconductor is used in a channel (active layer). In the TFT 20, a gate electrode 21, gate insulation films (first gate insulation film 22 and second gate insulation film 23), an oxide semiconductor layer 24, a channel protective film 25, and a source-drain electrode 26 are formed on the substrate 2 in this order. A passivation film 27 and a planarization film 28 are formed on the source-drain electrode 26 over the entire area of the pixel region 3 on the substrate 2.

The gate electrode 21 takes a role of controlling a carrier density (for example, density of electrons) in the oxide semiconductor layer 24 using a gate voltage which is applied to the TFT 20. The gate electrode 21 is configured of a single layer film which is formed using one of Mo, Al, an aluminum alloy, and the like, or a layered film which is formed using two or more types thereof. In addition, as the aluminum alloy, there is an aluminum-neodymium alloy, for example.

The first gate insulation film 22 and the second gate insulation film 23 are a single layer film which is formed using one of silicon oxide ($SiO_2$), silicon nitride ($Si_3N_4$), a silicon nitride oxide (SiON), an aluminum oxide ($Al_2O_3$), and the like, or a layered film which is formed using two or more types thereof. The gate insulation film may be configured using a single layer; however, here, the TFT 20 has a two-layer structure of the first gate insulation film 22 and the second gate insulation film 23. The first gate insulation film 22 is configured using the $SiO_2$ film, for example, and the second gate insulation film 23 is configured using the $Si_3N_4$ film, for example, respectively. The thickness of the first gate insulation film 22 and the second gate insulation film 23 in the layering direction (Z direction) (hereinafter, simply referred to as thickness) is 200 nm to 300 nm, for example.

The oxide semiconductor layer 24 includes at least one oxide among indium (In), gallium (Ga), zinc (Zn), tin (Sn), Al, and Ti, for example, as a main component. The oxide semiconductor layer 24 forms a channel between the source-drain electrodes 26 due to an application of a gate voltage. The thickness of the oxide semiconductor layer 24 is set to a degree of not causing deterioration in an ON current of a thin film transistor, preferably, so that a negative charge, which will be described later, does influence the channel, and is preferably 5 nm to 100 nm, specifically.

The channel protective film 25 is formed on the oxide semiconductor layer 24, and prevents damage of the channel when forming the source-drain electrodes 26. The thickness of the channel protective film 25 is 10 nm to 300 nm, for example.

The source-drain electrodes 26 is a single layer film which is formed using one of Mo, Al, copper (Cu), Ti, ITO, TiO, and the like, or is a layered film which is formed using two or more thereof. For example, it is preferable to use a three-layered film in which Mo, Al, and Mo are layered in this order with a thickness of 50 nm, 500 nm, and 50 nm, for example, or metal or a metal oxide with weak connection with oxygen such as a metal oxide including oxygen such as ITO and a titanium oxide. In this manner, it is possible to stably maintain an electrical property of the oxide semiconductor.

The passivation film 27 is configured of an inorganic insulation film with a thickness of 50 nm to 300 nm, for example. In the inorganic insulation film, it is possible to use a silicon oxide, silicon nitride, a silicon nitride oxide, an aluminum oxide, or the like, for example. The passivation film 27 may be configured using these single layer films, or a layered film. An organic material such as polyimide, and novolac may be used in the planarization film 28. The thickness of the planarization film 28 is for example, 500 nm to 4000 nm, and is 2000 nm or less, preferably. The organic EL element 10 is provided on the planarization film 28.

The organic EL element 10 sequentially includes an anode electrode 12 (first electrode), an insulation film between pixels 13, an organic layer 14, and a cathode electrode 15 (second electrode) in this order from a position which is close to the planarization film 28. The insulation film between pixels 13 has an opening which exposes a part of the surface of the anode electrode 12, and the opening of the insulation film between pixels 13 becomes a light emitting region of the organic EL element 10.

It is preferable that the anode electrode 12 also function as a reflecting layer, for example, and is configured of a material with high reflectance, and a high positive hole injection property. As such an anode electrode 12, it is possible to use a conductive material with a thickness of 100 nm to 300 nm, for example. As a constituent material of the anode electrode 12, there is a single body of a metal element such as chromium (Cr), gold (Au), platinum (Pt), nickel (Ni), copper (Cu), molybdenum (Mo), tungsten (W), titanium (Ti), tantalum (Ta), aluminum (Al), iron (Fe), or silver (Ag), or an alloy thereof. The anode electrode 12 may be an electrode in which a plurality of the metal films are layered. The anode electrode 12 may be configured so that a conductive material with high light permeability is used, and a reflecting layer is provided between the substrate 2 and the anode electrode 12.

The insulation film between pixels 13 secures an insulation property between the anode electrode 12 and the cathode electrode 15, and divides and separates a light emitting region of each organic EL element 10. The insulation film between pixels 13 is configured of a resin film such as a polyimide resin, an acrylic resin, or a novolac resin, for example. The insulation film between pixels 13 may be configured by layering an inorganic insulation material such as $SiO_2$ and $Si_3N_4$, and a resin material.

Figure 5:
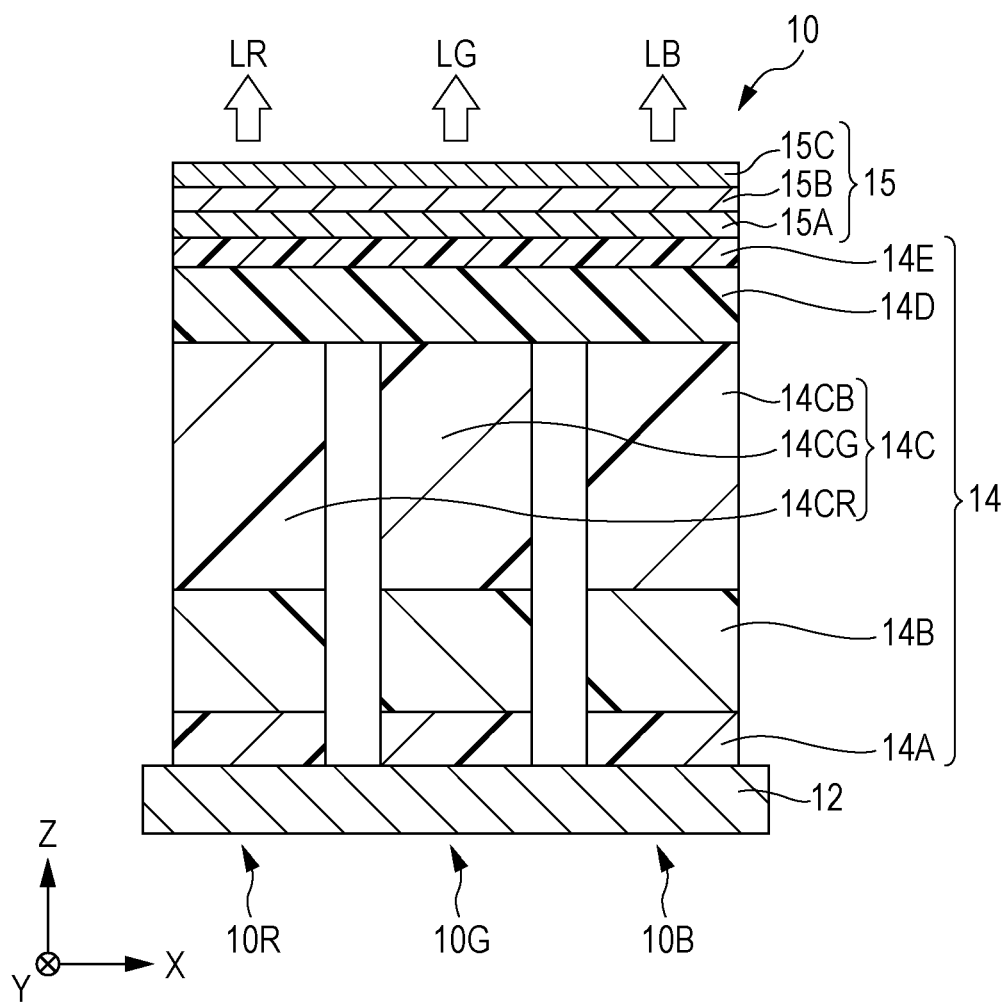
FIG. 5 is a cross-sectional view which illustrates an example of a configuration of an organic layer which is illustrated in FIG. 4.

An organic layer 14 is provided between the anode electrode 12 and the cathode electrode 15. FIG. 5 illustrates an example of a configuration of the organic layer 14. The organic layer 14 has a configuration in which a hole injection layer 14A, a hole transport layer 14B, a light emitting layer 14C (red light emitting layer 14CR, green light emitting layer 14CG, and blue light emitting layer 14CB), an electron transport layer 14D, and an electron injection layer 14E are layered in order from a position which is close to the anode electrode 12, for example. A top face of the organic layer 14 is covered with the cathode electrode 15. The red light emitting layer 14CR is provided in the red organic EL element 10R, and causes red light LR to be generated. The green light emitting layer 14CG is provided in the green organic EL element 10G, and causes green light LG to be generated, and the blue light emitting layer 14CB is provided in the blue organic EL element 10B, and causes blue light LB to be generated.

Figure 6:
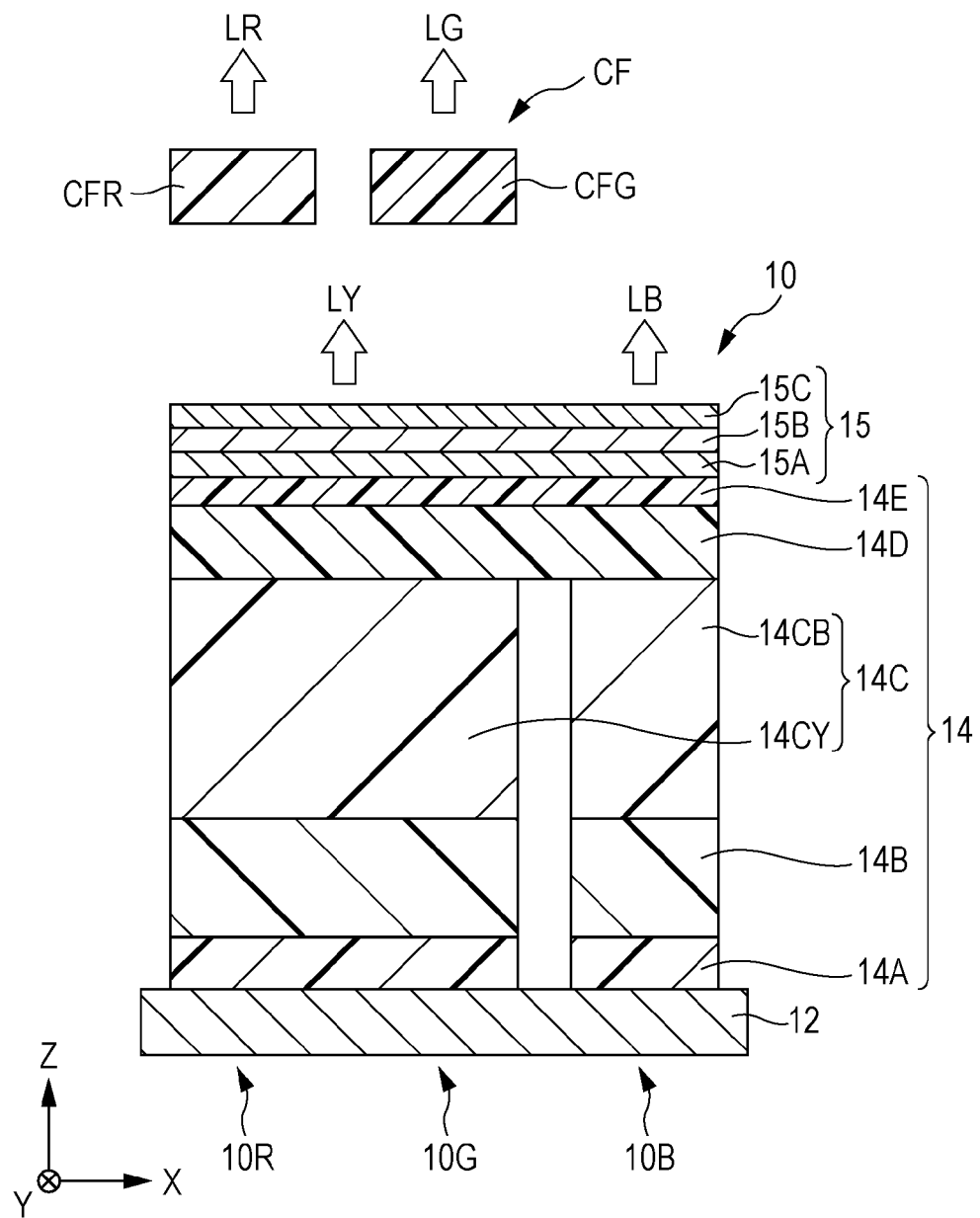
FIG. 6 is a cross-sectional view which illustrates another example of the organic layer which is illustrated in FIG. 5.

The light emitting layer 14C of the organic layer 14 may be configured using a yellow light emitting layer 14CY and the blue light emitting layer 14CB as illustrated in FIG. 6, for example. The yellow light emitting layer 14CY causes yellow light LY to be generated, and is provided in the red organic EL element 10R and the green organic EL element 10G. The yellow light LY is subjected to color separation into red light LR and green light LG using a color filter CF (red filter CFR, and green filter CFG). The blue light emitting layer 14CB is provided in the blue organic EL element 10B.

In the organic layer 14, the hole injection layer 14A, the hole transport layer 14B, the electron transport layer 14D, and the electron injection layer 14E are provided in the entire face of the pixel region 3, and become a common layer of all of the organic EL elements 10. The red light emitting layer 14CR, the green light emitting layer 14CG, and the yellow light emitting layer 14CY are provided in each organic EL element 10 according to a color of the organic EL element 10. The blue light emitting layer 14CB may be provided as a common layer of all of the organic EL elements 10 on the entire face of the pixel region 3, or may be provided in each organic EL element 10 according to a color of the organic EL element 10. A light emitting layer for emitting white light as a light emitting layer 14C may be provided as a common layer of all of the organic EL elements 10.

A film thickness, a constituent material, and the like, of each layer which configures the organic layer 14 are not particularly limited; however, an example is described below.

The hole injection layer 14A increases injection efficiency of holes with respect to the light emitting layer 14C, and is a buffer layer for preventing leaking. The thickness of the hole injection layer 14A is preferably 5 nm to 200 nm, for example, and is more preferably 8 nm to 150 nm. A constituent material of the hole injection layer 14A may be appropriately selected in a relationship between the material and an electrode or a material of a neighboring layer, and there are, for example, polyaniline, polythiophene, polypyrrole, polyphenylene vinylene, polythienylene vinylene, polyquinoline, polyquinoxaline, and a derivative thereof, a conductive polymer such as a polymer including a structure of aromatic amine in a main chain or a side chain, metal-lophthalocyanine (copper phthalocyanine), carbon, and the like. As a specific example of the conductive polymer, there is oligoaniline, and polydioxythiophene such as poly (3,4-ethylene dioxythiophene) (PEDOT).

The hole transport layer 14B increases hole transport efficiency with respect to the light emitting layer 14C. The thickness of the hole transport layer 14B is preferably 5 nm to 200 nm, for example, and more preferably 8 nm to 150 nm, though it depends on the entire configuration of the element. As a material which configures the hole transport layer 14B, it is possible to use a light emitting material which is soluble in an organic solvent, for example, polyvinyl carbazole, polyfluorene, polyaniline, polysilane or a derivative thereof, a polysiloxane derivative which includes aromatic amine in a main chain or a side chain, polythiophene and a derivative thereof, polypyrrole, $Alq_3$, or the like.

In the light emitting layer 14C, an electron and a hole are recombined when an electric field is applied, and light is emitted. The thickness of the light emitting layer 14C is preferably 10 nm to 200 nm, for example, and is more preferably 20 nm to 150 nm, though it depends on the entire configuration of the element. The light emitting layers 14C may be a single layer or a layered structure, respectively.

As a material which configures the light emitting layer 14C, a material corresponding to a respective light emitting color may be used, and there is, for example, a polyfluorene-based high polymer derivative, a (poly) paraphenylene vinylene derivative, a polyphenylene derivative, a polyvinyl carbazole derivative, a polythiopene derivative, perylene-based dyestuff, coumarin-based dyestuff, rhodamine-based dyestuff, or a material in which an organic EL material is doped with respect to the above described high polymer. As a doping material, it is possible to use, for example, rubrene, perylene, 9,10-diphenylanthracene, tetraphenyl butadiene, nile red, coumarine 6, or the like. In addition, as a material which configures the light emitting layer 14C, two or more types of the above described material may be mixed and used. In addition, the material is not limited to the above described material of high molecular weight, and a material of a low molecular weight may be combined and used. As an example of a low molecular material, there is benzine, styrylamine, triphenylamine, porphyrin, triphenylene, azatriphenylene, tetracyanoquinodimethane, triazole, imidazole, oxadiazole, polyaryl alkane, phenylenediamines, arylamine, oxazole, anthracene, fluorenone, hydrazone, stilbene, or a derivative thereof, or monomer or oligomer of heterocyclic conjugated system such as polysilane-based compound, vinyl calbazole-based compound, thiophene-based compound, or aniline-based compound.

As a material of the light emitting layer 14C, it is also possible to use a material with high light emitting efficiency as a light emitting guest material, for example, an organic light emitting material such as a low molecular phosphor material, phosphorescence dyestuff, or metal complex in addition to the above described materials.

In addition, the light emitting layer 14C may be a light emitting layer with a hole transport property which also functions as the above described hole transport layer 14B, for example, and may be a light emitting layer with an electron transport property which also functions as the electron transport layer 14D which will be described later.

The electron transport layer 14D and the electron injection layer 14E are layers for increasing electron transport efficiency with respect to the light emitting layer 14C. A total film thickness of the electron transport layer 14D and the electron injection layer 14E is preferably 5 nm to 200 nm, and is more preferably 10 nm to 180 nm, though it depends on the entire configuration of the element.

As a material of the electron transport layer 14D, it is preferable to use an organic material with an excellent electron transport ability. By increasing transport efficiency of the light emitting layer 14C, it is possible to suppress a change in a luminous color due to field intensity. Specifically, it is preferable to use an arylpyridine derivative, a benzimidazole derivative, or the like. The reason for this is that it is possible to maintain high electron supply efficiency even in a low driving voltage in this manner. As a material of the electron injection layer 14E, there is alkali metal, alkali earth metal, rare earth metal and an oxide thereof, a complex oxide, fluoride, carbonate, or the like.

The cathode electrode 15 is configured of a material of which the thickness is approximately 10 nm, with good light permeability, and with a small work function, for example. In addition, it is also possible to secure light extraction by forming a transparent conductive film using an oxide. In this case, it is possible to use ZnO, ITO, IZnO, InSnZnO, or the like. A cathode electrode 15 with a single layer structure may be used; however, here, a case in which the cathode electrode 15 has a layered structure of a first layer 15A, a second layer 15B, and a third layer 15C in order from a position which is close to the anode electrode 12, for example, will be described.

It is preferable to form the first layer 15A using a material with a small work function, and with good light permeability. Specifically, for example, there is alkali earth metal such as calcium (Ca), and barium (Ba), alkali metal such as lithium (Li), cesium (Cs), indium (In), magnesium (Mg), and silver (Ag). The first layer 15A may be formed using an alkali metal oxide such as $Li_2O$, $Cs_2Co_3$, $Cs_2SO_4$, MgF, LiF and $CaF_2$, and alkali metal, fluoride, alkali earth metal oxide, or alkali earth fluoride.

The second layer 15B is configured of a material with light permeability and good conductivity such as an MgAg electrode and a Ca electrode of a thin film. In the third layer 15C, it is preferable to use a transparent lanthanoid oxide in order to suppress deterioration in an electrode. In this manner, it is possible to be used as a sealing electrode which is capable of taking out light from a top face. In addition, when the display device 1 is a bottom emission type, as a material of the third layer 15C, gold (Au), platinum (Pt), AuGe, or the like, is used.

Such a cathode electrode 15 is a common electrode of all of organic EL elements 10, for example, and is provided all over the pixel region 3 of the substrate 2.

In addition, in the cathode electrode 15, a mixed layer which contains an organic light emitting material such as aluminum quinoline complex, a styrylamine derivative, and a phthalocyanine derivative may be used. In this case, the cathode electrode 15 may further include a layer which has light permeability such as MgAg. In addition, as a matter of course, the cathode electrode 15 may take an optimal combination and layered structure according to a structure of a created device, without being limited to the above described layered structure. In the above descriptions, the cathode electrode 15 with a layered structure in which a function of each layer of the electrode is divided, that is, into an inorganic layer which prompts electron injection to the organic layer 14 (first layer 15A), an inorganic layer which manages the electrode (second layer 15B), and an inorganic layer which protects the electrode (third layer 15C) has been described; however, one layer may have a plurality of functions. For example, the inorganic layer which prompts electron injection to the organic layer 14 may also function as the inorganic layer which manages the electrode.

When the organic EL element 10 has a cavity structure, it is preferable that the cathode electrode 15 is configured using a semi-transmissive and semi-reflective material. Due to this, emission light which is subjected to multiple interference between a light reflecting face on the anode electrode 12 side and a light reflecting face on the cathode electrode 15 side is taken out from the cathode electrode 15 side. In this case, an optical distance between the light reflecting face on the anode electrode 12 side and the light reflecting face on the cathode electrode 15 side is defined due to a wavelength of light which is desired to be taken out, and the film thickness of each layer is set so as to satisfy the optical distance. In such a display element of a top face emission type, it is possible to improve light extraction efficiency to the outside, or to control a light emission spectrum by positively using the cavity structure.

The cathode electrode 15 is covered with a protective layer (not illustrated). The protective layer is a layer for preventing infiltration of moisture into the organic layer 14, and is formed with a thickness of, for example, 2 μm to 3 μm using a material with low permeability and water permeability. The protective layer may be configured of either one of an insulating material and a conductive material. As the insulating material, it is preferable to use an inorganic amorphous insulating material, for example, amorphous silicon (α-Si), amorphous silicon carbide (α-SiC), amorphous silicon nitride ($\alpha\text{-}Si_{1-x}N_x$), amorphous carbide (α-C), or the like. Since such an inorganic amorphous insulating material does not constitute a grain, the material has low water permeability, and becomes a good protective film.

The filling layer 16 between the protective layer and the sealing substrate 17 is a layer for preventing infiltration of moisture into the organic layer 14, and increasing a mechanical strength of the display device 1. Light transmissivity of the filling layer 16 is approximately 80%, and a thickness thereof is, for example, 3 μm to 20 μm. It is possible to use an epoxy resin, an acrylic resin, or the like, for example, in the filling layer 16.

The sealing substrate 17 is located on the cathode electrode 15 side of the organic EL element 10, and seals the organic EL element 10 along with a bonding layer (not illustrated). The sealing substrate 17 is configured of a material such as glass which is transparent with respect to light which is generated in the organic EL element 10. For example, a color filter and a light shielding film as a black matrix (both are not illustrated) are provided in the sealing substrate 17, the filter and the film take out light which is generated in the organic EL element 10, absorb outside light which is reflected in wiring between each of organic EL elements 10, and improve contrast.

The color filter (for example, color filter CF in FIG. 6) which is provided in the sealing substrate 17 includes a red filter, a green filter, and a blue filter (none are illustrated), for example, and the filters are arranged corresponding to the red pixel 5R, the green pixel 5G, and the blue pixel 5B, respectively. The red filter, the green filter, and the blue filter are in a rectangular shape, respectively, for example, and are formed without a gap therebetween. The red filter, the green filter, and the blue filter are respectively configured using a resin in which pigment is mixed, and by selecting the pigment, it is possible to adjust light permeability of a target color of red, green, or blue in a wavelength range to be high, and light permeability in other wavelength ranges to be low.

The light shielding film is configured of, for example, a black resin film in which a black coloring agent is mixed, and of which optical density is 1 or more, or a thin film filter using an interference of a thin film. It is preferable when the light shielding film is configured using the black resin film, not the thin film filter, since it is possible to easily form the light shielding film at a low cost. The thin film filter is a filter in which a thin film which is formed of, for example, metal, metal nitride, or metal oxide of one or more which are layered, and light is attenuated using an interference of the thin film. As the thin film filter, specifically, there is a filter in which Cr and chromium oxide (III) ($Cr_2O_3$) are alternately layered.

Figure 7:
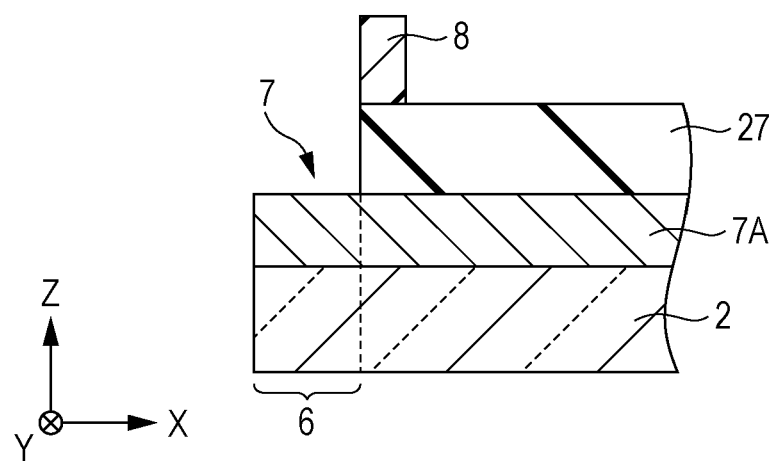
FIG. 7 is a diagram which illustrates a configuration in a cross section which is taken along line VII-VII illustrated in FIG. 1.

FIG. 7 illustrates a detailed configuration of the terminal region 6 which is provided in the peripheral region 4, and illustrates a configuration in a cross section which is taken along line VII-VII in FIG. 1. Wiring 7A is provided in the peripheral region 4 on the substrate 2, and the passivation film 27 which extends from the pixel region 3 covers the wiring 7A. The wiring 7A is electrically connected to the cathode electrode 15, for example. The wiring 7A is exposed from the passivation film 27 in the terminal region 6. In other words, the wiring 7A which is exposed from the passivation film 27 configures the terminal 7. In the terminal 7, for example, flexible printed circuits (FPC) (not illustrated), and the like, are connected. In FIG. 1, a case in which the terminal region 6 is provided on two sides of the substrate 2 is illustrated; however, the terminal region 6 may be provided on only one side of the substrate 2, and may be provided on three sides of the substrate 2. The terminal region 6 may be arranged on all sides of the substrate 2.

According to the embodiment, a partitioning wall 8 is provided between the terminal region 6 in which the terminal 7 is arranged and the pixel region 3. Though it will be described in detail later, due to this, it is possible to prevent an organic material from flowing into the terminal region 6 from the pixel region 3 when forming the organic layer 14. Here, the pixel region 3 is one specific example of the organic layer forming region of the present technology, and the terminal region 6 is one specific example of the organic layer non-forming region of the present technology.

The partitioning wall 8 is provided, for example, on the passivation film 27. The height of the partitioning wall 8 (distance in Z direction) is, for example, 500 nm to 4000 nm, and the width of the partitioning wall 8 (distance in X direction in FIG. 7) is 5 μm to 100 μm. The partitioning wall 8 is provided at a position which is close to the terminal region 6 in the peripheral region 4, for example. The partitioning wall 8 is configured of an organic material such as a polyimide resin, an acrylic resin, and a novolac resin, for example. The partitioning wall 8 may be configured using the same organic material as that which is contained in the insulation film between pixels 13. The partitioning wall 8 may have a liquid repellent property. For example, a partitioning wall 8 with a liquid repellent property may be provided by mixing fluorine into the above described organic material. Alternately, the partitioning wall 8 with the liquid repellent property may be provided by performing a plasma treatment, or a fluorine processing treatment.

Figure 8:
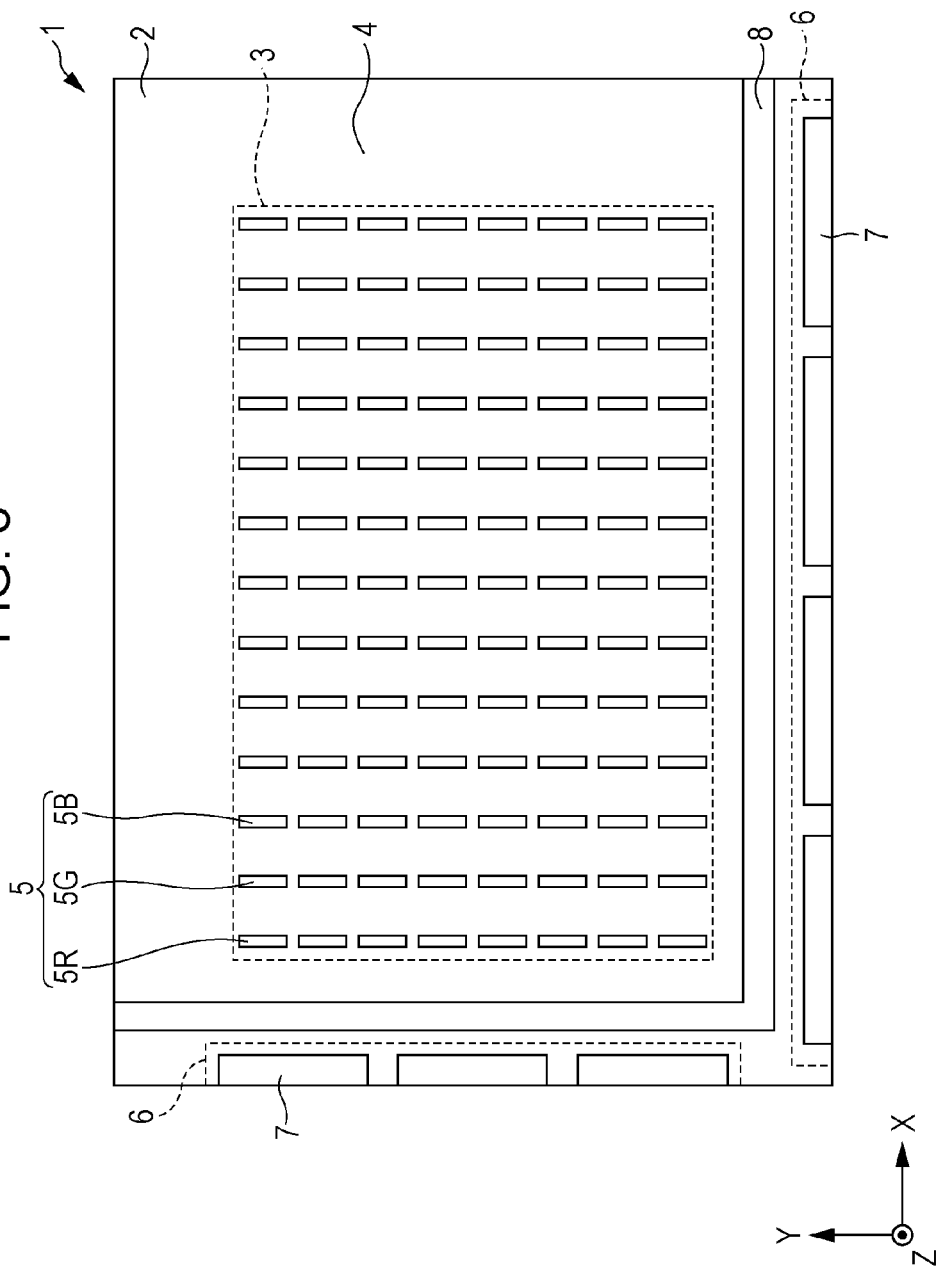
FIG. 8 is a plan view which illustrates another example of a partitioning wall which is illustrated in FIG. 1.

The partitioning wall 8 may be provided so as to surround the pixel region 3 (FIG. 1). As illustrated in FIG. 8, the partitioning wall may be provided at a side of the substrate 2 in which the terminal region 6 is arranged.

Figure 9:
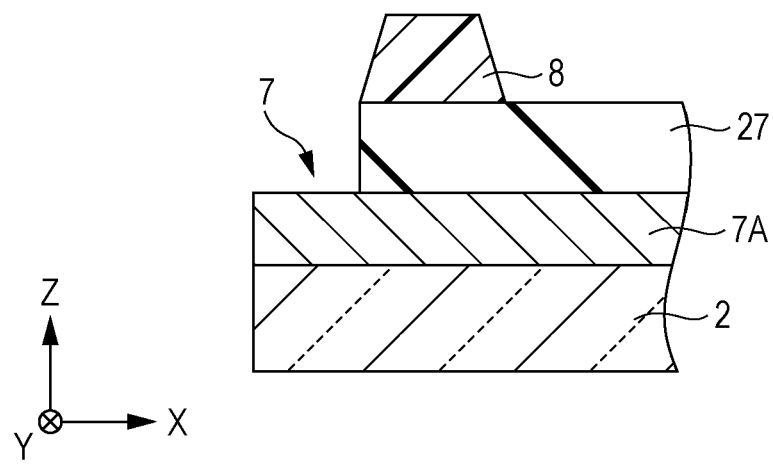
FIG. 9 is a diagram which illustrates another example of the partitioning wall in a cross-sectional shape illustrated in FIG. 7.
Figure 10:
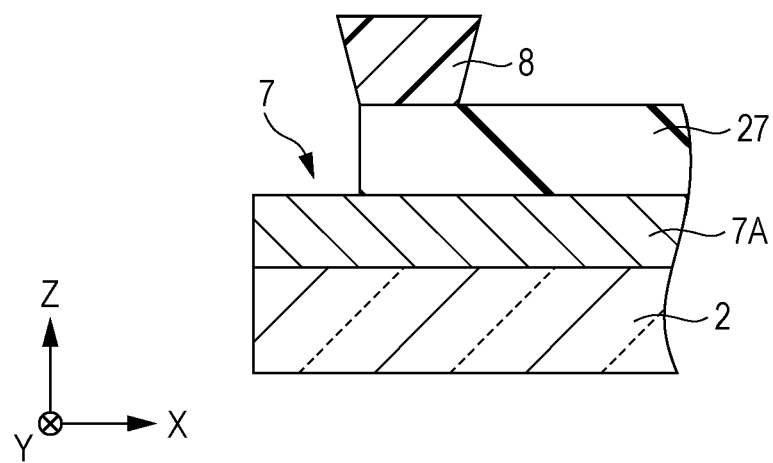
FIG. 10 is a diagram which illustrates still another example of the partitioning wall in a cross-sectional shape which is illustrated in FIG. 7.

A cross-sectional shape of the partitioning wall 8 is a rectangular shape (FIG. 7). The partitioning wall 8 may have a tapered shape, or a reversed tapered shape (FIGS. 9 and 10).

A sealing agent (sealing agent 19 in FIG. 16 which will be described later) and wiring (wiring 29 in FIG. 18 which will be described later) to which the cathode electrode 15 is connected, and the like, are provided in the peripheral region 4 on the substrate 2, in addition to the terminal 7.

Manufacturing Method of Display Device 1

Figure 12A:
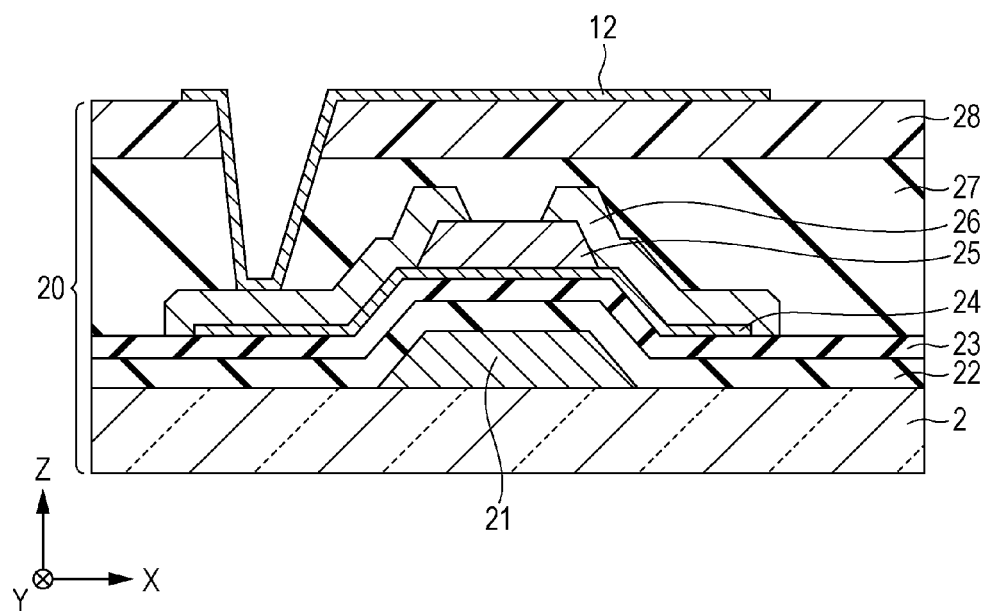
FIG. 12A is a cross-sectional view which illustrates the manufacturing process of the display device illustrated in FIG. 1.
Figure 12B:
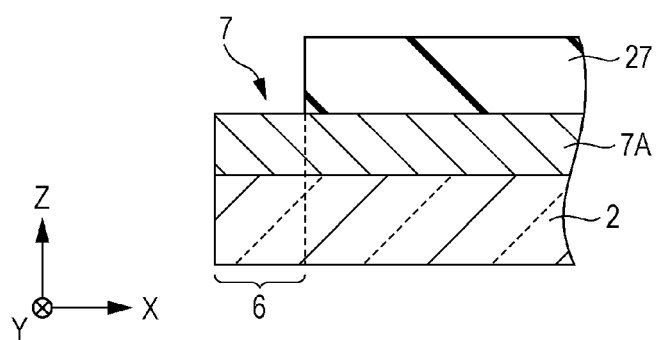
FIG. 12B is another cross-sectional view which illustrates the manufacturing process of the display device which is illustrated in FIG. 1.
Figure 13A:
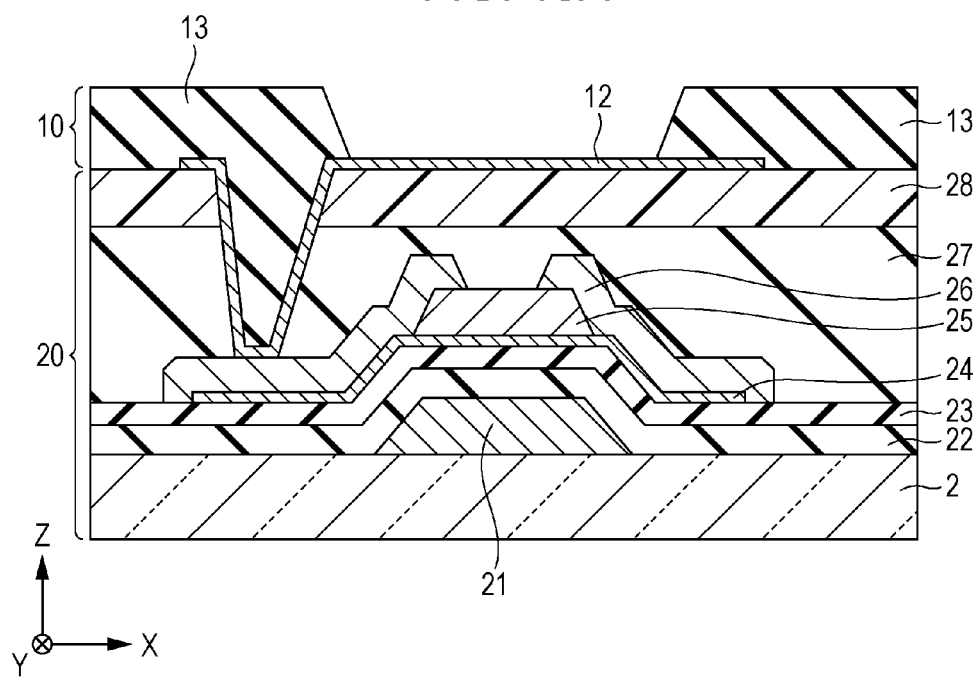
FIG. 13A is a cross-sectional view which illustrates a consecutive process of the process in FIG. 12A.
Figure 13B:
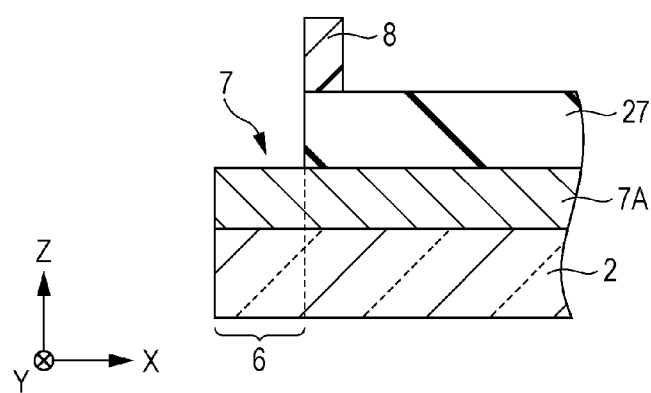
FIG. 13B is a cross-sectional view which illustrates a consecutive process of the process in FIG. 12B.
Figure 14A:
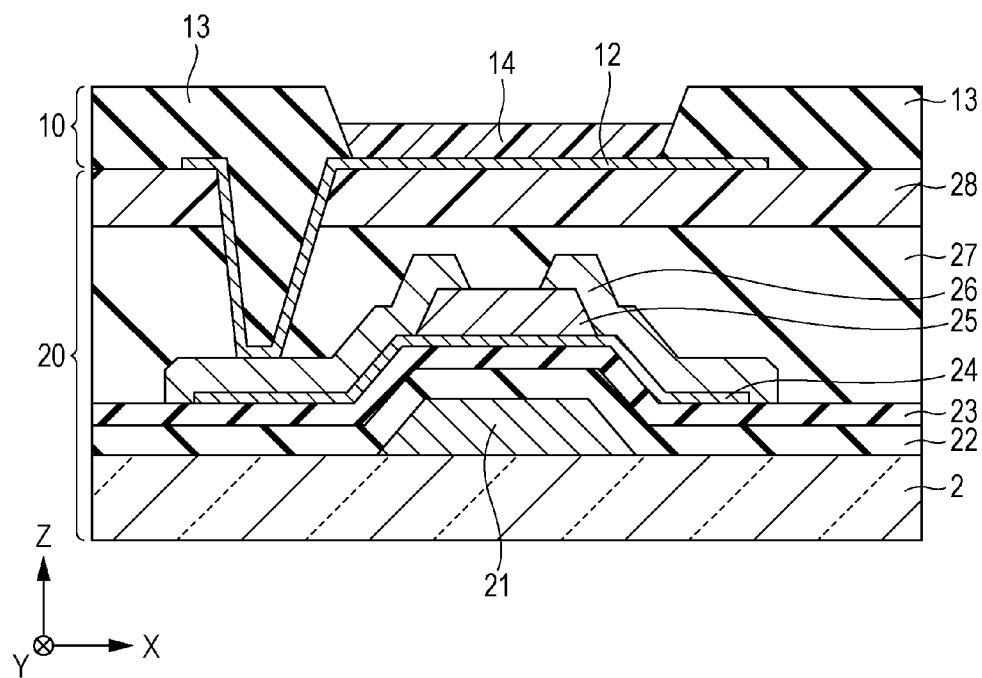
FIG. 14A is a cross-sectional view which illustrates a consecutive process of the process in FIG. 13A.
Figure 14B:
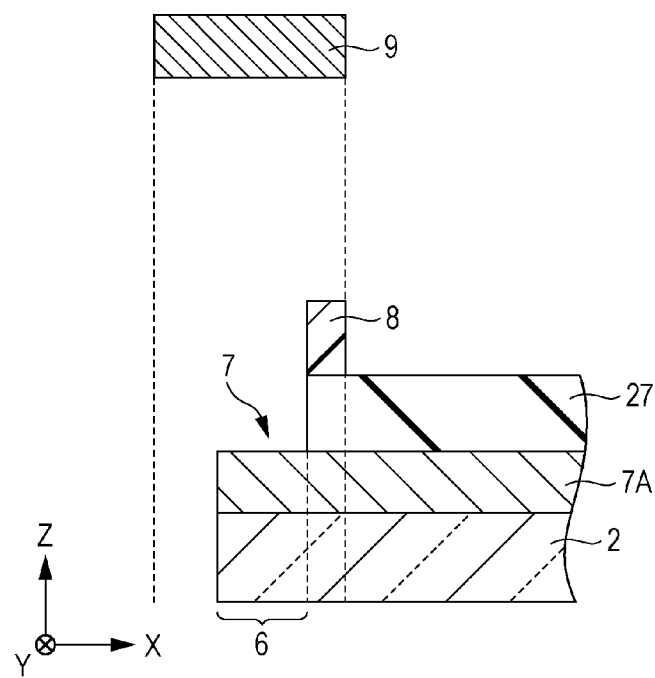
FIG. 14B is a cross-sectional view which illustrates a consecutive process of the process in FIG. 13B.

FIG. 11 illustrates an example of a manufacturing process of the display device 1. The above described display device 1 is manufactured as follows, for example (FIGS. 12A to 14B). FIGS. 12A, 13A, and 14A illustrate a configuration in a cross section of the pixel region 3, and FIGS. 12B, 13B, and 14B illustrate a configuration in a cross section in the vicinity of the terminal region 6.

Formation Process of TFT 20 and Terminal 7

First, the gate electrode 21, the first gate insulation film 22, the second gate insulation film 23, the oxide semiconductor film 24, the channel protective film 25, and the source-drain electrodes 26 are formed in this order in the pixel region 3 on the substrate 2 after a predetermined thin film process. At this time, the wiring 7A is formed in the peripheral region 4 on the substrate 2. Subsequently, the passivation film 27 and the planarization film 28 are formed using a spin coating method or a slit coating method, for example, over the entire surface of the substrate 2. Subsequently, a part of the wiring 7A is exposed by patterning the formed planarization film 28 and passivation film 27 into predetermined shapes using a photolithography method, for example, and the terminal 7 is formed (FIG. 12B).

Formation Process of Anode Electrode 12 (S101)

As illustrated in FIG. 12A, the anode electrode 12 is formed in each organic EL element 10 after providing the TFT 20. The anode electrode 12 is formed by forming, for example, an AlNd alloy over the entire surface of the substrate 2 using a sputtering method, and then patterning the formed AlNd alloy using, for example, a photolithography method.

Formation Process of Insulation Film between Pixels 13 and Partitioning Wall 8 (S102)

Subsequently, for example, a polyimide resin is subjected to film formation over the entire surface of the substrate 2, and is patterned into a desired shape, thereafter. In this manner, the insulation film between pixels 13 is formed in the pixel region 3, and the partitioning wall 8 is formed in the peripheral region 4 (FIGS. 13A and 13B).

Formation Process of Organic Layer 14 and Cathode Electrode 15 (S103 and S104)

Subsequently, the organic layer 14 is formed in the pixel region 3 (FIG. 14A). Specifically, the organic layer 14 is formed as follows, for example. First, the hole injection layer 14A and the hole transport layer 14B are subjected to film formation over the entire surface of the pixel region 3 using a vacuum deposition method, for example. The vacuum deposition method is a method in which various materials are deposited on the substrate 2 from a deposition source. When forming the organic layer 14 on the entire surface of the pixel region 3, deposition is performed by providing a mask having an opening with the same shape as the pixel region 3 between the deposition source and the substrate 2. After providing the hole transport layer 14B, the red light emitting layer 14CR is formed in the red pixel 5R, the green light emitting layer 14CG is formed in the green pixel 5G, and the blue light emitting layer 14CB is formed in the blue pixel 5B, respectively. The light emitting layer 14C (red light emitting layer 14CR, green light emitting layer 14CG, and blue light emitting layer 14CB) is formed using a printing method such as an ink jet printing method, a slit printing method, a stripe printing method, and a nozzle printing method, for example. Such a printing method is a method in which ink in which an organic material configuring the red light emitting layer 14CR, the green light emitting layer 14CG, or the blue light emitting layer 14CB is dissolved in organic solvent is applied on the substrate 2. Viscosity of ink is 10 cP or less, for example. When forming the light emitting layer 14C, a region in which the light emitting layer 14C is not provided, such as the terminal region 6, is covered with a non-contact-type mask 9 (FIG. 14B). It is preferable to arrange the mask 9 so as to cover the partitioning wall 8, as well. According to the embodiment, since the partitioning wall 8 is formed in the peripheral region 4, ink is blocked by the partitioning wall 8. Accordingly, it is possible to prevent ink from flowing into the terminal region 6 from the pixel region 3. The blue light emitting layer 14CB may be formed over the entire surface of the pixel region 3 after forming the red light emitting layer 14CR and the green light emitting layer 14CG. As the light emitting layer 14C, the yellow light emitting layer 14CY and the blue light emitting layer 14CB may be formed using a printing method (FIG. 6). After providing the light emitting layer 14C, the electron transport layer 14D, the electron injection layer 14E, the cathode electrode 15, and the protective layer are formed in this order using, for example, a vacuum deposition method. The cathode electrode 15 may be formed using a sputtering method.

Formation Process of Sealing Substrate 17

A light shielding film and a color filter are formed on the sealing substrate 17 as follows, for example. First, a plurality of openings corresponding to arrangements of the pixels 5 are formed by performing film formation of a constituent material of the light shielding film on the entire surface of the sealing substrate 17, and patterning the constituent material which is subjected to the film formation in a matrix using a photolithography process, for example, thereafter. In this manner, the light shielding film is formed. Subsequently, the color filter is formed by providing a red filter, a green filter, and a blue filter in the opening of the light shielding film by sequential patterning thereof.

Process of Bonding Substrate 2 and Sealing Substrate 17

The sealing substrate 17 which is formed as described above is bonded to the substrate 2 by interposing the organic EL element 10 and the filling layer 16 therebetween using a one drop fill (ODF) process, for example. As described above, the display device 1 illustrated in FIG. 1 is completed.

Operations of Display Device 1

In the display device 1, when a driving current corresponding to an image signal of each color is applied to each organic EL element 10, electrons and holes are injected into the organic layer 14 through the anode electrode 12 and the cathode electrode 15. These electrons and holes are recombined in the light emitting layer 14C which is included in the organic layer 14, respectively, and emit light. The light is reflected in the anode electrode 12, penetrates the cathode electrode 15, the color filter, and the sealing substrate 17, and is taken out to the outside. In this manner, in the display device 1, a full color image of, for example, R, G, and B is displayed.

Operation and Effect of Display Device 1

Here, in the display device 1, since the partitioning wall 8 is provided between the pixel region 3 and the terminal region 6 on the substrate 2, it is possible to prevent flowing of ink (organic material) into the terminal region 6 from the pixel region 3 when forming the organic layer 14. Hereinafter, this process will be described.

The vacuum deposition method is a method which is useful when forming the organic layer 14 in the entire region of the pixel region 3; however, it is difficult to form the organic layer 14 such as the light emitting layer 14C in each pixel 5 using the vacuum deposition method. The reason for this is that alignment of the mask and the substrate 2, and use efficiency of a material deteriorate. Meanwhile, the printing method is useful also in a case in which the organic layer 14 is formed in each pixel 5, and a case in which the organic layer 14 is formed in the entire pixel region 3. Specifically, a nozzle printing method is suitable for forming of the organic layer 14 since it is possible to stably apply a fixed amount of ink. The nozzle printing method is a method of applying an organic material by causing ink to be usually ejected from nozzles.

However, since viscosity of ink which is used in such a printing method is low, ink easily flows into the peripheral region 4 from the pixel region 3. The terminal region 6, or the like, is provided in the peripheral region 4. When ink is attached to the terminal region 6, it is not possible to secure an electrical connection between the terminal 7 and external wiring (for example, FPC), and there is a concern that yield, reliability, and the like, may deteriorate.

As a method of protecting the terminal region from attaching of the organic material, for example, a contact-type masking using adhesive tape has been proposed (refer to Japanese Unexamined Patent Application Publication Nos. 2009-266766 and 2008-678). However, in this method, an adhesive remains on the constituent members of the display device, and there is a concern that reliability of the display device may deteriorate. In addition, since a meniscus of ink is formed at an edge of the adhesive tape, there is a concern that a protrusion may occur in the organic layer due to this. In addition, it is also possible to take using of the printing method without masking the terminal region into consideration; however, there is the following problem, for example. The nozzle printing method is a useful method as described above; however, it is not possible to prevent attaching of the organic material without performing masking, since ink is usually ejected. The ink jet method is a method of easily applying ink only to a desired region; however, in order to form the organic layer with high accuracy in each pixel, an expensive device is necessary. That is, it has an influence on cost. In the slit printing method and the stripe printing method, since it is difficult to control a film thickness at the peripheral portion of a region for applying, the organic layer is formed over a range wider than the pixel region, in consideration of this point. For this reason, when the terminal region is arranged on the outer side of the ink application region, a so-called frame region becomes wide, and there is a concern that the appearance of the display device may be influenced.

In contrast to this, in the display device 1, since the partitioning wall 8 is provided between the pixel region 3 and the terminal region 6, ink which is applied to the pixel region 3 when forming the organic layer 14 (light emitting layer 14C) is blocked in the partitioning wall 8. That is, ink stays inside of the terminal region 6, and flowing of ink into the terminal region 6 from the pixel region 3 is suppressed. It is possible to form the organic layer 14 with a uniform film thickness using the nozzle printing method.

In addition, since the adhesive tape is not used, the adhesive does not remain, and it is possible to maintain reliability. In addition, also the protrusion of the organic layer due to the adhesive tape is not formed.

In addition, it is possible to perform the nozzle printing method, and the ink jet printing method, the slit printing method, the stripe printing method, and the like, using a cheap device, using the non-contact-type mask (for example, mask 9 in FIG. 14B). Accordingly, it is possible to suppress an increase in cost, and an increase of a frame region.

As described above, according to the embodiment, since the partitioning wall 8 is provided on the substrate 2, it is possible to prevent attaching of the organic material to the terminal region 6 when forming the organic layer 14. Accordingly, it is possible to improve yield and reliability of the display device 1 by securing the electric connection between the terminal 7 and the external wiring.

In addition, it is also possible to form the partitioning wall 8 using the same process as that of the insulation film between pixels 13 of the pixel region 3, and to suppress an increase in the manufacturing process.

Hereinafter, modification examples of the first embodiment, and other embodiments will be described; however, the same constituent elements as those in the first embodiment will be given the same reference numerals, and descriptions will be appropriately omitted.

Modification Example 1

Figure 15:
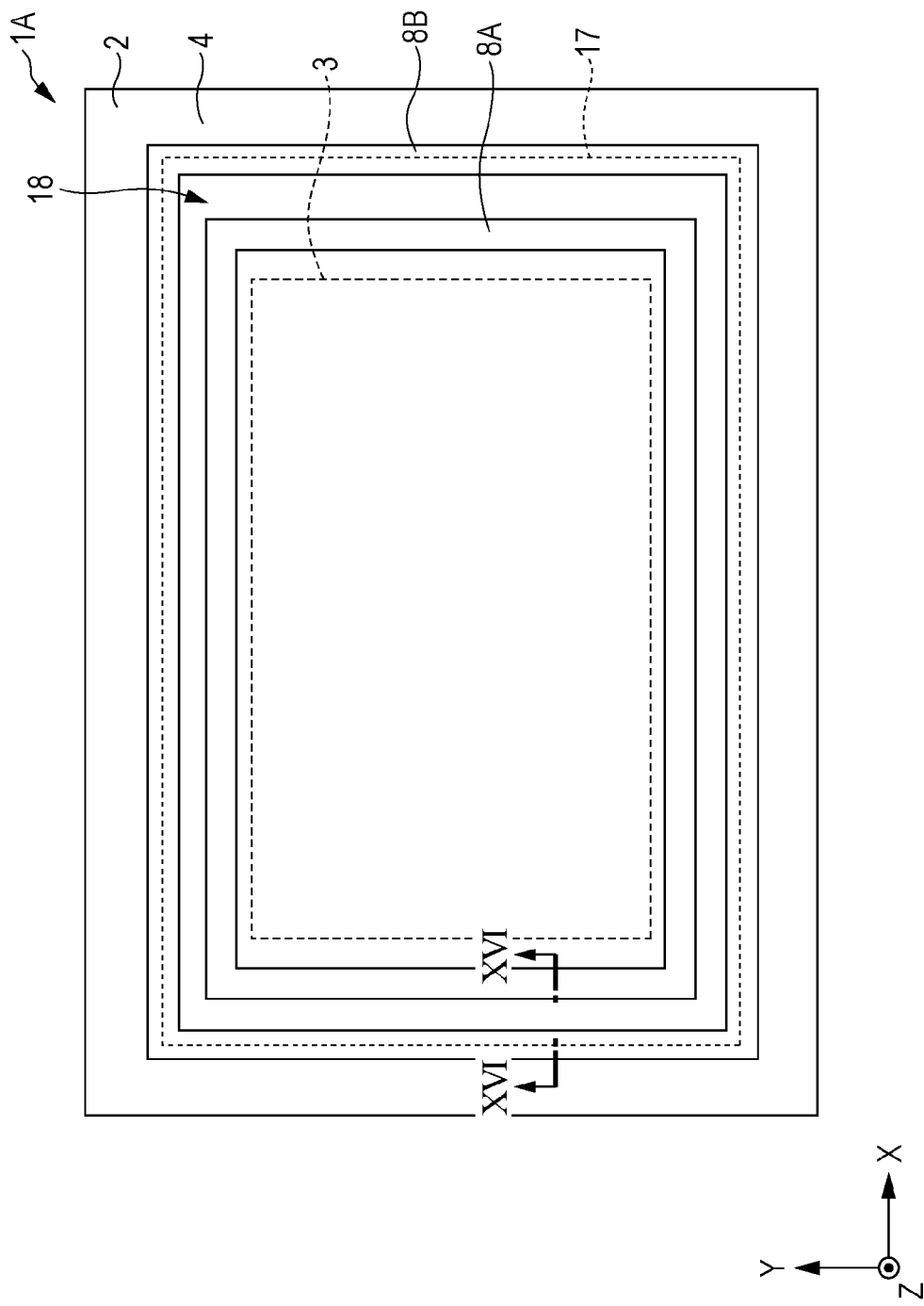
FIG. 15 is a plan view which illustrates a configuration of a display device according to a modification example 1.

FIG. 15 illustrates a planar configuration of a display device (display device 1A) according to a modification example 1. The display device 1A has a partitioning wall (partitioning wall 8A) between a pixel region 3 and a sealing region (sealing region 18). That is, here, the sealing region 18 is one specific example of the organic layer non-forming region according to the present technology. The display device 1A has the same configuration as that of the display device 1 except for this point, and operations and effects thereof are the same as those of the display device 1.

Figure 16:
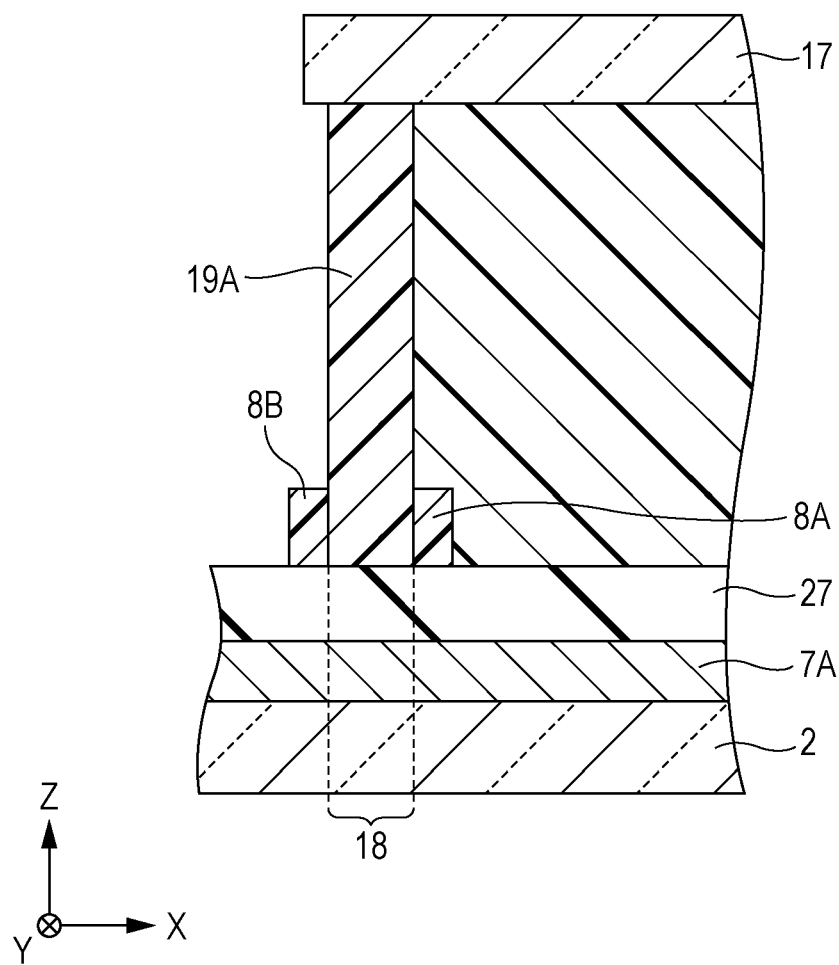
FIG. 16 is a diagram which illustrates a configuration in a cross section which is taken along line XVI-XVI illustrated in FIG. 15.

FIG. 16 illustrates a configuration in a cross section which is taken along line XVI-XVI illustrated in FIG. 15. A sealing agent 19 is provided in the sealing region 18 on the substrate 2. The sealing agent 19 is for bonding the substrate 2 and a sealing substrate 17 to each other, and is provided at the periphery of a filling layer 16 between the substrate 2 and the sealing substrate 17. That is, the sealing region 18 is provided so as to surround the pixel region 3. The sealing agent 19 takes a role of preventing infiltration of moisture into the pixel region 3 from the outside, and is configured of an epoxy resin, an acrylic resin, or the like, for example.

When it is assumed that an organic material of the organic layer 14 (FIG. 4) is attached to the sealing region 18, bonding between the sealing agent 19 and the substrate 2 is hindered, and sealing strength deteriorates. In addition, moisture easily infiltrates into the pixel region 3 from the outside. Accordingly, there is a concern that reliability of the display device may deteriorate.

Since the partitioning wall 8A is provided between the pixel region 3 and the sealing region 18 in the display device 1A, it is possible to prevent attaching of the organic material to the sealing region 18 when forming the organic layer 14 (FIG. 4). Accordingly, it is possible to maintain reliability of the display device 1A. A constituent material, a height, a width, and the like, of the partitioning wall 8A are the same as those of the above described partitioning wall 8.

It may be a configuration in which a partitioning wall 8B is provided on the outer side of the partitioning wall 8A, and the sealing region 18 is arranged between the partitioning walls 8A and 8B. The partitioning wall 8B is provided on the outer side of the sealing region 18, that is, between the sealing region 18 and an edge of the substrate 2 in the peripheral region 4. The partitioning wall 8B may be configured using the same material as that of the partitioning wall 8A, and have the same height and width as those of the partitioning wall 8A, for example. By providing such a partitioning wall 8B, it is possible to prevent flowing of ink into the sealing region 18, even if ink is attached to the outer side of the sealing region 18. When forming the organic layer 14, a mask (mask 9 in FIG. 14B) for covering the partitioning walls 8A and 8B along with the sealing region 18 is arranged.

Modification Example 2

Figure 17:
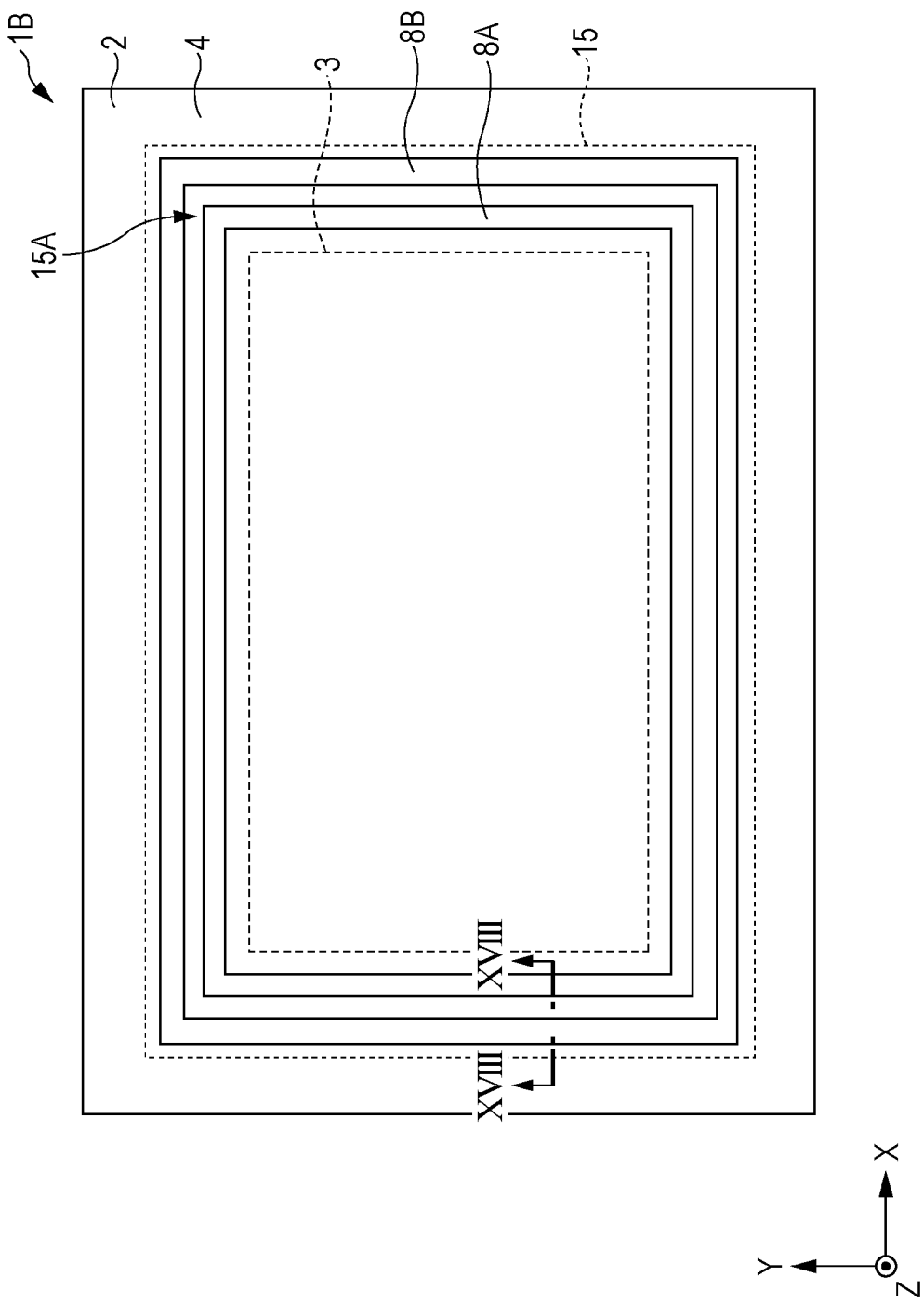
FIG. 17 is a plan view which illustrates a configuration of a display device according to a modification example 2.

FIG. 17 illustrates a planar configuration of a display device (display device 1B) according to a modification example 2. The display device 1B includes a partitioning wall 8A between a pixel region 3 and a connection region (connection region 15A). That is, here, the connection region 15A is one specific example of the organic layer non-forming region according to the present technology. The display device 1B has the same configuration as that of the display device 1 except for this point, and operations and effects thereof are the same as those of the display device 1.

Figure 18:
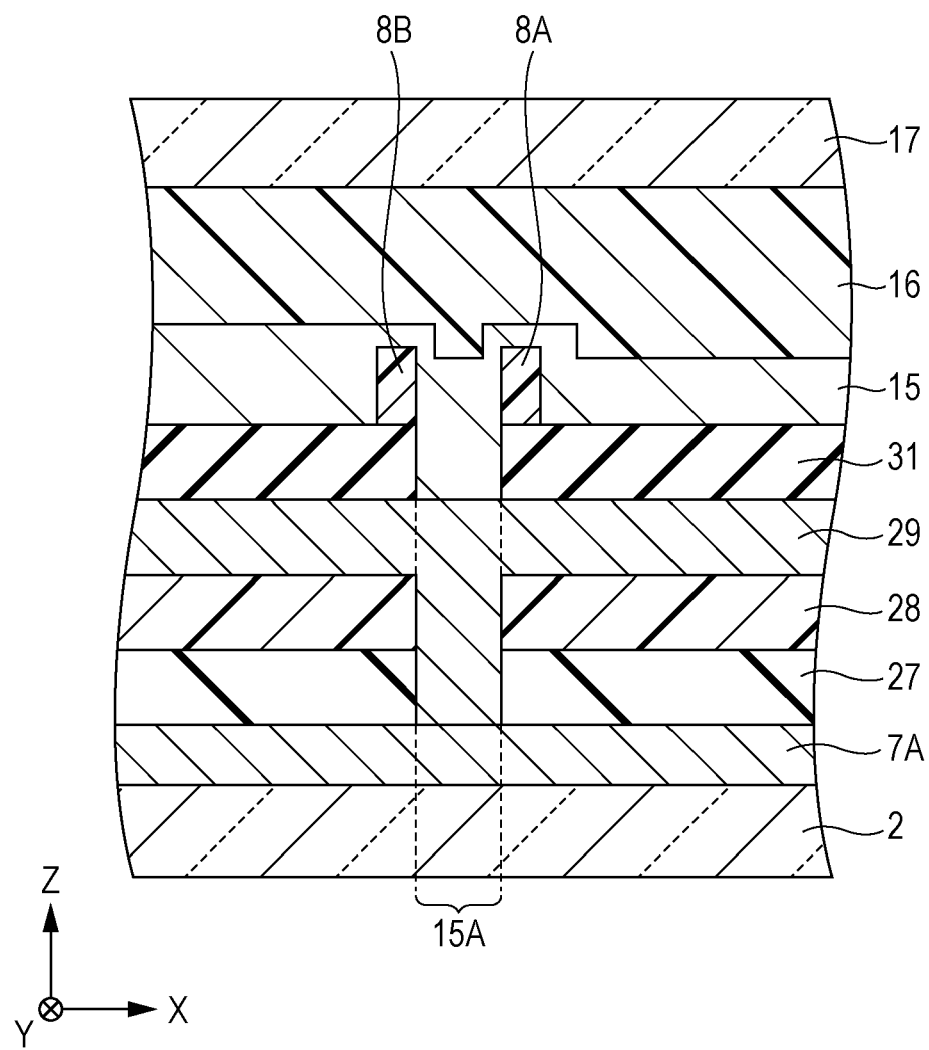
FIG. 18 is a diagram which illustrates a configuration in a cross section which is taken along line XVIII-XVIII illustrated in FIG. 17.

FIG. 18 illustrates a configuration in a cross section which is taken along line XVIII-XVIII which is illustrated in FIG. 17. A cathode electrode 15 extends from a pixel region 3 to a peripheral region 4, and is electrically connected to wiring 29 in the peripheral region 4. The wiring 29 is provided on a planarization film 28, for example, and an insulation film 31 is interposed between the wiring 29 and the cathode electrode 15. In the connection region 15A which is provided in the peripheral region 4, a connection hole is provided in the insulation film 31, and the cathode electrode 15 and the wiring 29 are connected through the connection hole. The wiring 29 is electrically connected to a common power supply line (GND), for example, If an organic material of the organic layer 14 (FIG. 4) is attached to the connection region 15A, it is not possible to secure the electrical connection between the cathode electrode 15 and the wiring 29, and there is a concern that yield, reliability, and the like, may deteriorate.

Since the partitioning wall 8A is provided between the pixel region 3 and the connection region 15A in the display device 1B, it is possible to prevent attaching of the organic material to the connection region 15A when forming the organic layer 14 (FIG. 4). Accordingly, it is possible to maintain yield, reliability, and the like, of the display device 1B. Similarly to the descriptions in the above described display device 1A, the connection region 15A may be arranged between the partitioning walls 8A and 8B, by providing the partitioning wall 8B on the outer side of the partitioning wall 8A. By providing such a partitioning wall 8B, it is possible to prevent flowing of ink into the connection region 15A even if ink is attached to the outer side of the connection region 15A. A mask (mask 9 in FIG. 14B) for covering the partitioning walls 8A and 8B along with the connection region 15A is arranged when forming the organic layer 14.

Modification Example 3

Figure 19:
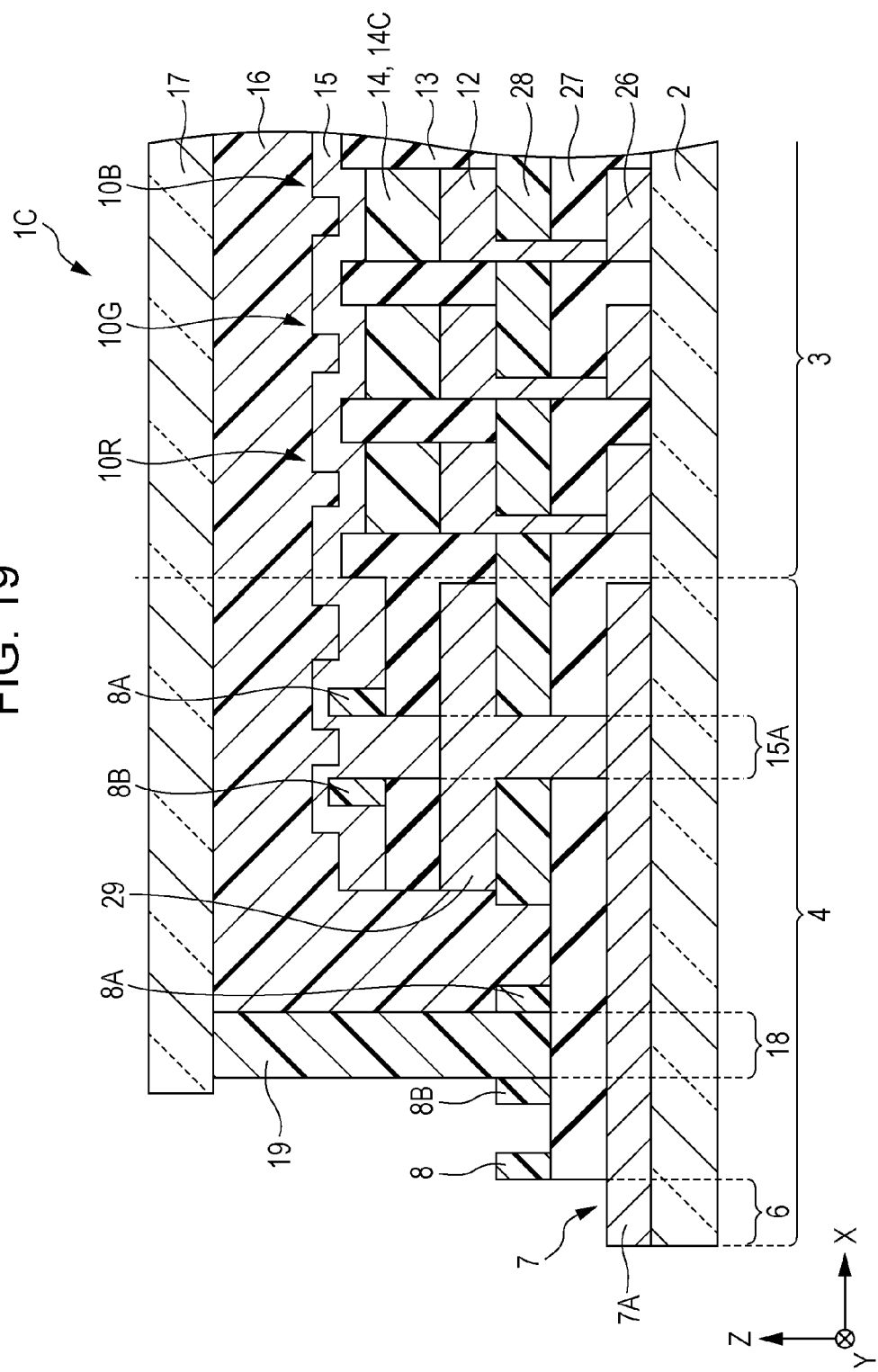
FIG. 19 is a cross-sectional view which illustrates a configuration of a display device according to a modification example 3.

FIG. 19 illustrates a configuration in a cross section of main parts of a display device (display device 1C) according to a modification example 3. The display device 1C includes a connection region 15A, a sealing region 18, and a terminal region 6 in order from a position which is close to a pixel region 3. That is, the display device 1C includes a plurality of organic layer non-forming regions in a peripheral region 4. In the display device 1C, partitioning walls (partitioning wall 8 or 8A) are respectively provided between the pixel region 3 and the connection region 15A, between the pixel region 3 and the sealing region 18, and between the pixel region 3 and the terminal region 6 on the substrate 2. Specifically, the partitioning wall is provided between neighboring organic layer non-forming regions (between connection region 15A and sealing region 18, and between sealing region 18 and terminal region 6), in addition to the position between the pixel region 3 and the organic layer non-forming region (connection region 15A) which is closest to the pixel region 3. The display device 1C has the same configuration as that of the display device 1 except for this point, and operations and effects thereof are the same as those of the display device 1.

In the connection region 15A and the sealing region 18, a partitioning wall 8B is provided on the outer side of the partitioning wall 8A. That is, the connection region 15A and the sealing region 18 are respectively provided between the partitioning walls 8A and 8B. By providing the partitioning wall 8B, when forming the organic layer 14 (FIG. 4), it is possible to prevent flowing of ink into the connection region 15A and the sealing region 18, even if ink (organic material) is attached to a portion between the connection region 15A and the sealing region 18, or between the sealing region 18 and the terminal region 6. The terminal region 6 may be arranged between partitioning walls by further providing a partitioning wall (not illustrated) on the outer side of the terminal region 6.

Modification examples 4 to 6 (display devices 1D to 1F) which will be described later include a connection region 15A, a sealing region 18, and a terminal region 6 in order from a position which is close to a pixel region 3, similarly to the above described display device 1C. In the display devices 1D to 1F, a partitioning wall (partitioning wall 8 or 8A) is arranged between any two regions of the regions and the pixel region 3.

Modification Example 4

Figure 20:
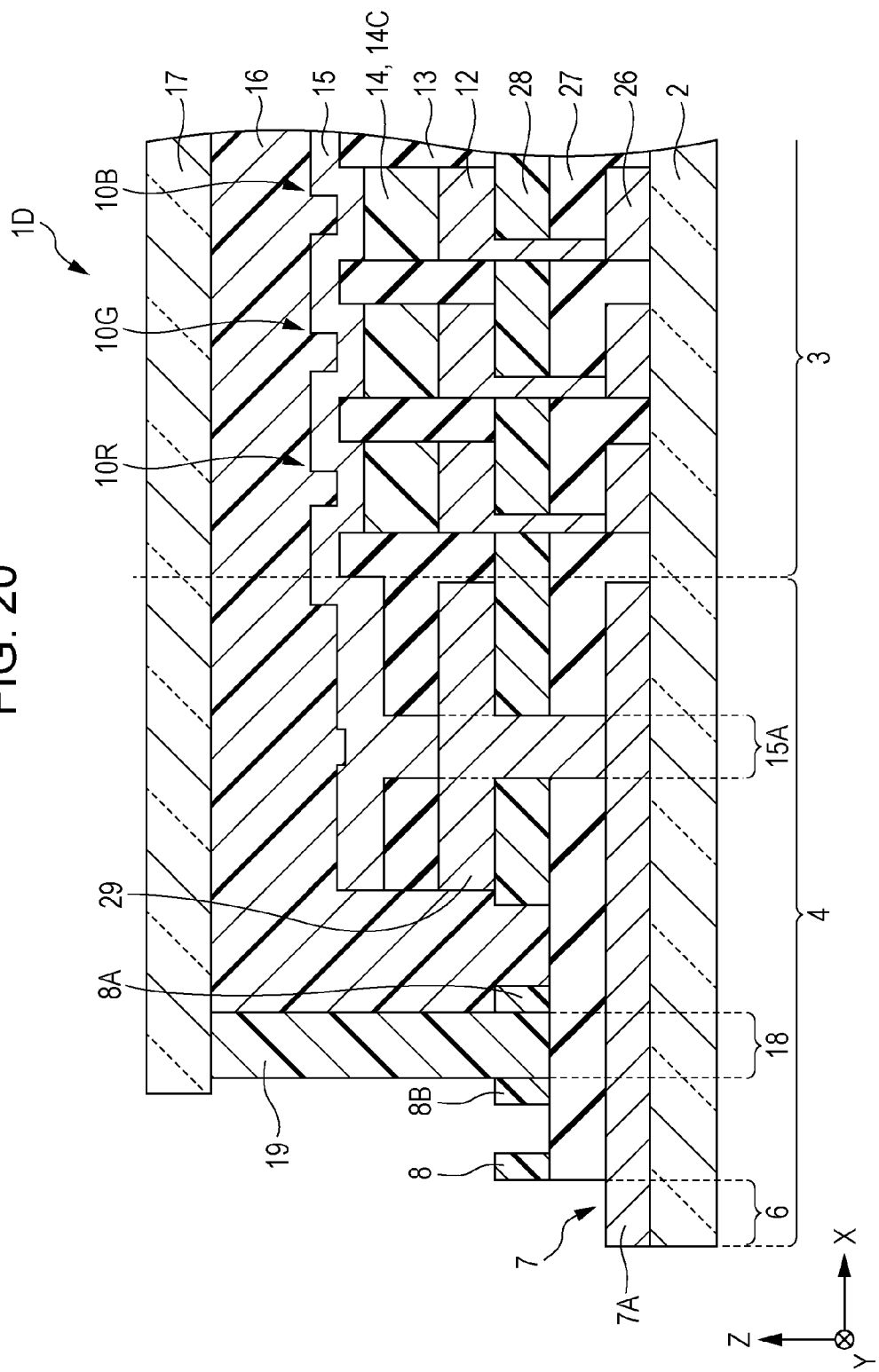
FIG. 20 is a cross-sectional view which illustrates a configuration of a display device according to a modification example 4.

As illustrated in FIG. 20, in the display device 1D, a partitioning wall (partitioning wall 8 or 8A) is provided between a pixel region 3 and a sealing region 18, and between the pixel region 3 and a terminal region 6. In detail, the partitioning wall is provided between the connection region 15A and the sealing region 18, and between the sealing region 18 and the terminal region 6. In the sealing region 18, the partitioning wall 8B is provided on the outer side of the partitioning wall 8A. That is, the sealing region 18 is arranged between the partitioning walls 8A and 8B.

Modification Example 5

Figure 21:
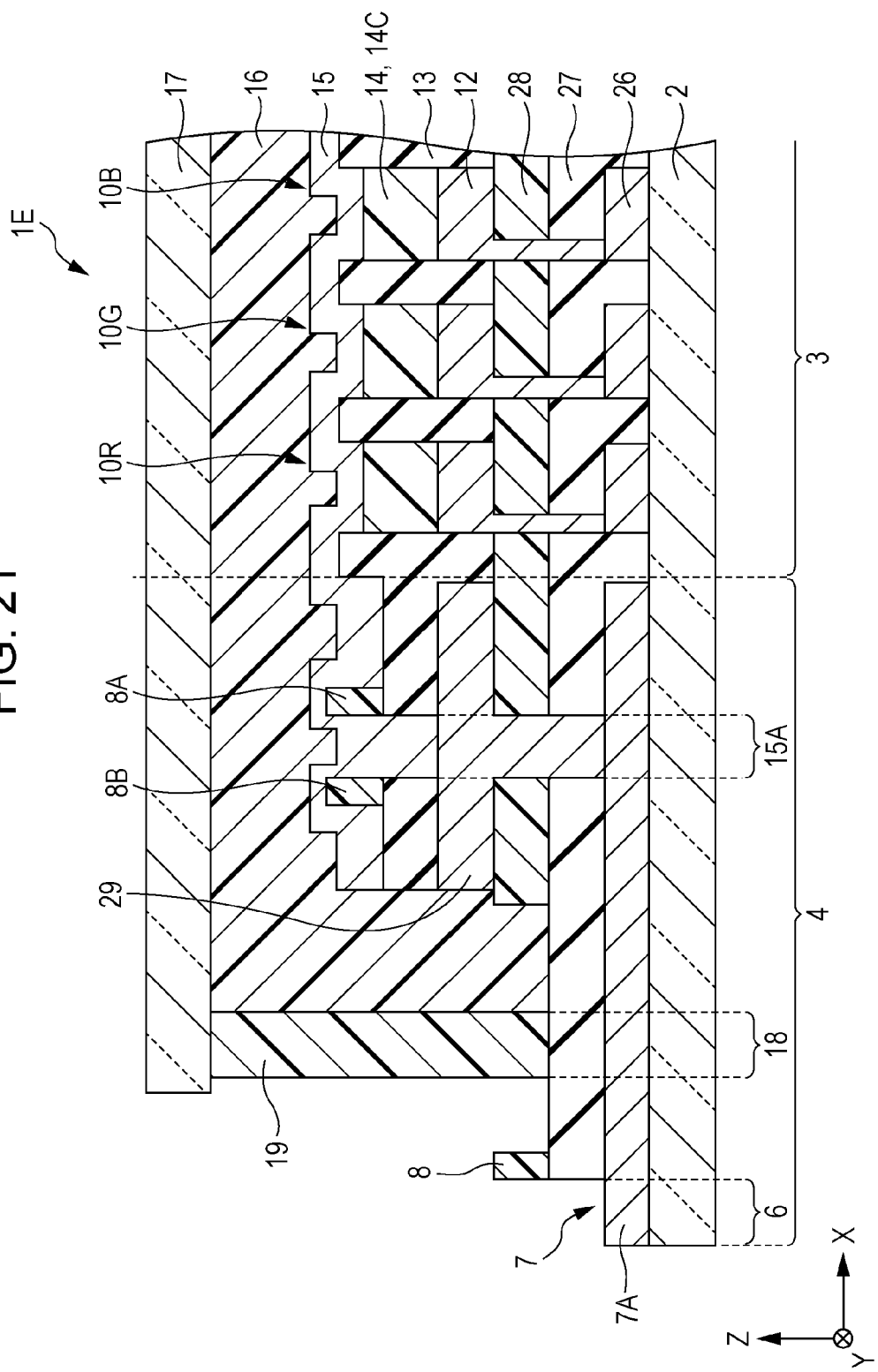
FIG. 21 is a cross-sectional view which illustrates a configuration of a display device according to a modification example 5.

As illustrated in FIG. 21, in the display device 1E, a partitioning wall (partitioning wall 8 or 8A) is provided between a pixel region 3 and a connection region 15A, and between the pixel region 3 and a terminal region 6. In detail, the partitioning wall is provided between the pixel region 3 and the connection region 15A, and between the sealing region 18 and the terminal region 6. In the connection region 15A, the partitioning wall 8B is provided on the outer side of the partitioning wall 8A. That is, the connection region 15A is arranged between the partitioning walls 8A and 8B.

Modification Example 6

Figure 22:
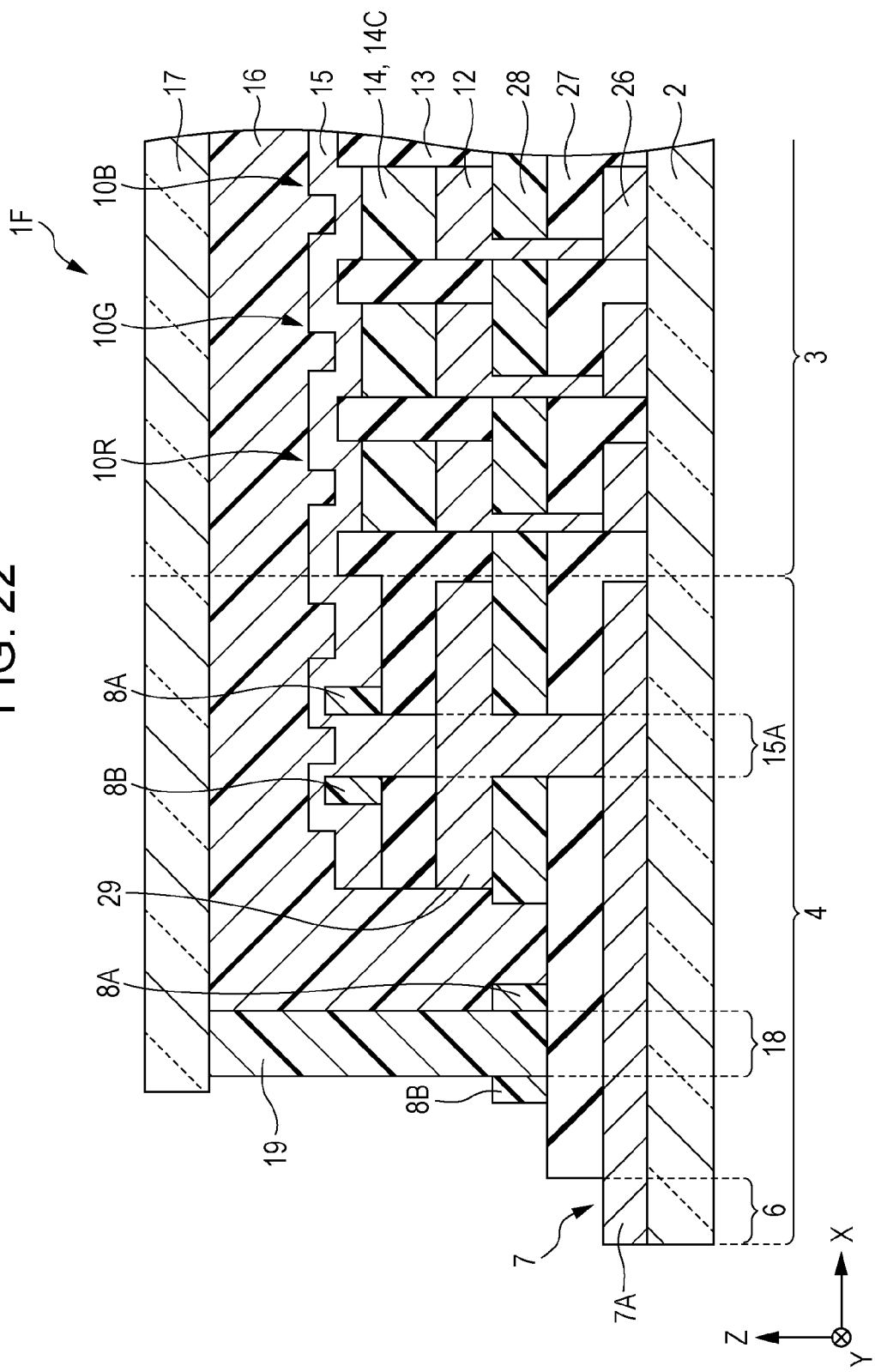
FIG. 22 is a cross-sectional view which illustrates a configuration of a display device according to a modification example 6.

As illustrated in FIG. 22, in the display device 1F, a partitioning wall 8A is provided between a pixel region 3 and a connection region 15A, and between the pixel region 3 and a sealing region 18. In detail, the partitioning wall 8A is provided between the pixel region 3 and the connection region 15A, and between the connection region 15A and the sealing region 18. In the connection region 15A and the sealing region 18, a partitioning wall 8B is provided on the outer side of the partitioning wall 8A. That is, the connection region 15A and the sealing region 18 are respectively arranged between the partitioning walls 8A and 8B.

Second Embodiment

Figure 23:
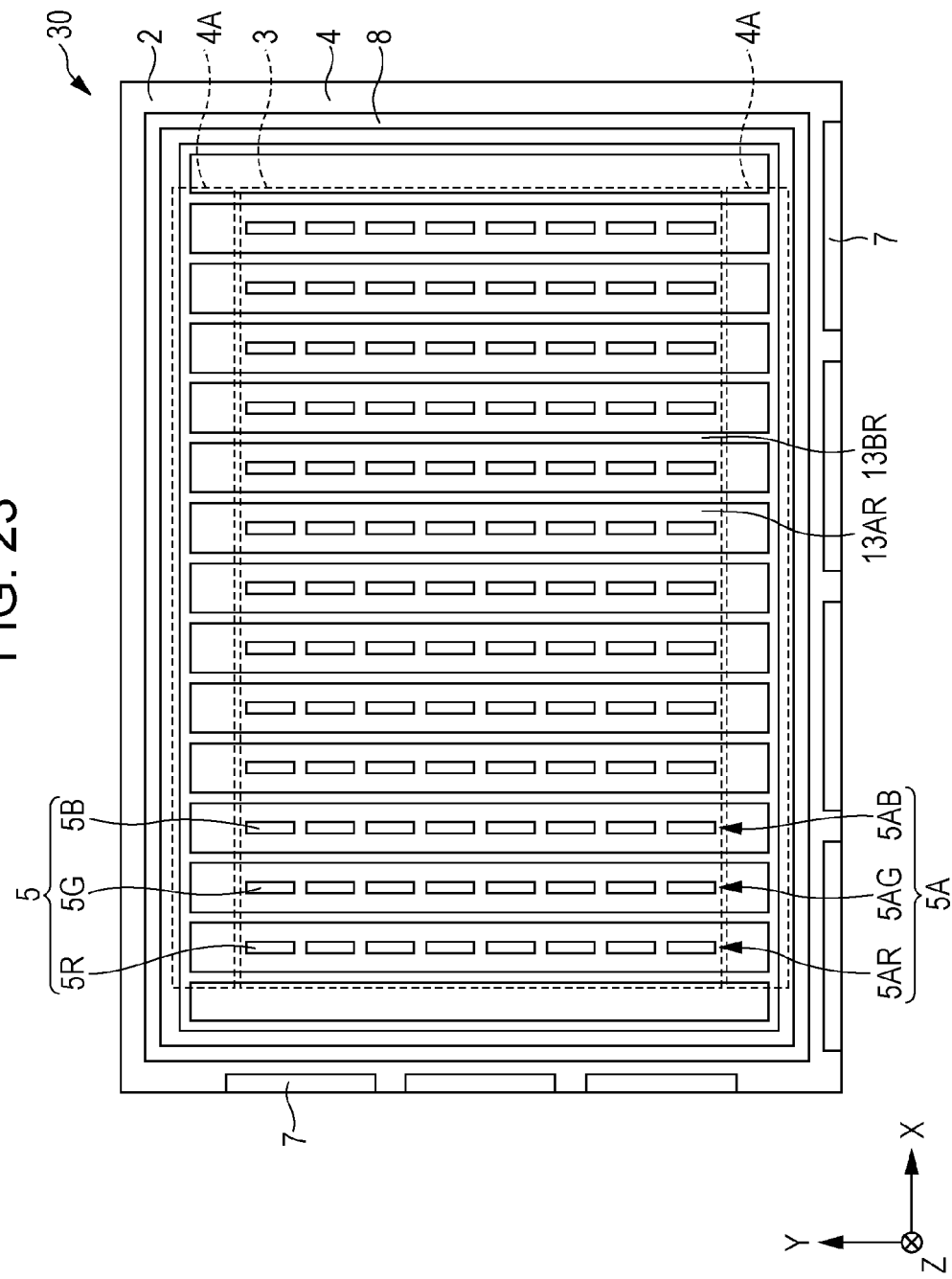
FIG. 23 is a plan view which illustrates a configuration of a display device according to a second embodiment of the present technology.
Figure 24:
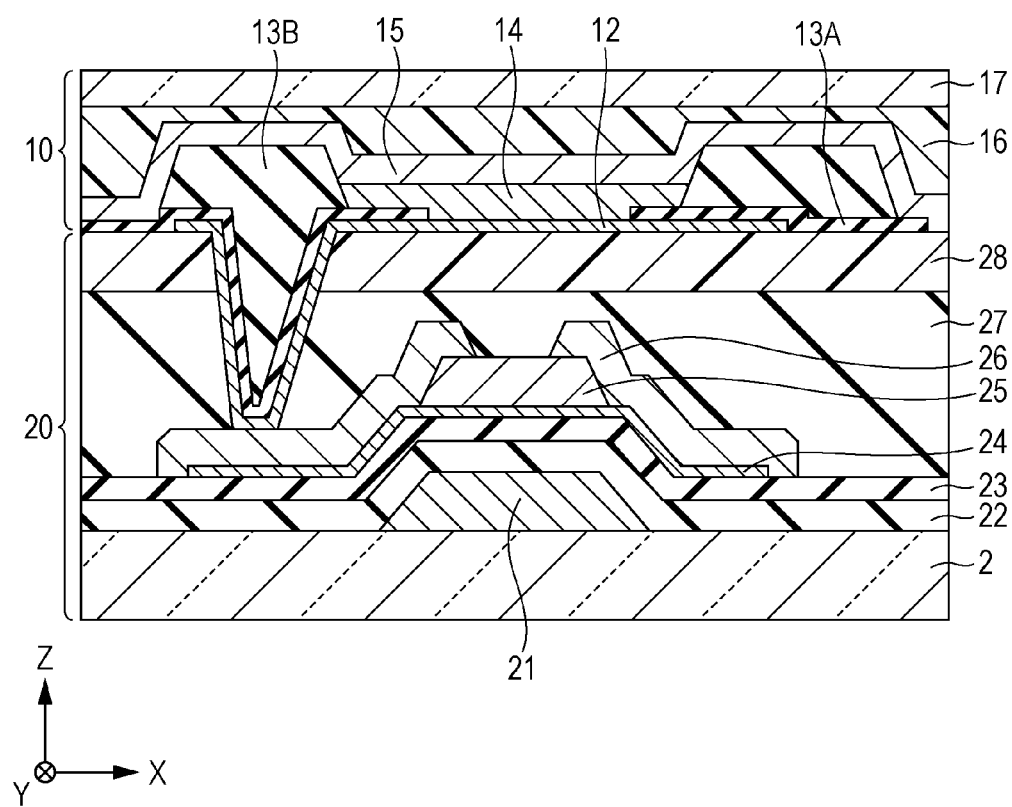
FIG. 24 is a cross-sectional view which illustrates a configuration of a pixel region illustrated in FIG. 23.

FIG. 23 illustrates a planar configuration of a display device (display device 30) according to a second embodiment of the present technology, and FIG. 24 illustrates a configuration in a cross section of a pixel region 3 of the display device 30. In the display device 30, a liquid repellent region (liquid repellent region 13BR) is provided between pixel columns 5A of each color (red pixel column 5AR, green pixel column 5AG, and blue pixel column 5AB). The display device 30 has the same configuration as that of the display device 1 except for this point, and operations and effects thereof are the same as those of the display device 1.

In the display device 30, for example, a nozzle printing method, a slit printing method, a stripe printing method, or the like, is used when forming an organic layer 14. The liquid repellent region 13BR extends in the same direction as the pixel column 5A, and functions as a bank of ink when applying a light emitting layer (light emitting layer 14C in FIG. 5) of each color of the organic layer 14. The liquid repellent region 13BR is provided in a line so as to partition (divide) the pixel column 5A. Due to the liquid repellent region 13BR, it is possible to suppress excessive wet-spreading of ink which is ejected to the pixel column 5A, and to prevent infiltration of ink into a neighboring pixel column 5A. It is preferable for the liquid repellent region 13BR to extend to a peripheral region 4, and to have a frame portion which surrounds the pixel region 3. It is possible to suppress wet-spreading of ink which is ejected to the peripheral region 4 when starting application, for example, by also providing the liquid repellent region 13BR in the peripheral region 4. For example, a partitioning wall 8 is provided on the outer side of the frame-shaped liquid repellent region 13BR. The liquid repellent region 13BR is formed using a liquid repellent layer 13B (FIG. 24).

It is preferable that the periphery of the pixel 5 become a lyophilic region 13AR. The lyophilic region 13AR is a region for improving wettability of ink, and is provided between the liquid repellent region 13BR which extends in the column direction and a pixel 5, and between neighboring pixels 5 (region between rows) in the column direction. Each pixel 5 is surrounded with the lyophilic region 13AR. The lyophilic region 13AR is configured of a lyophilic layer 13A (FIG. 24).

A bead formation region 4A, for example, is provided at a part of the peripheral region 4. The bead formation region 4A is provided on two sides facing each other by interposing the pixel region 3 therebetween. The bead formation region is a region in which ink is ejected to an application start position in the peripheral region 4, and a liquid column (bead) is formed, when forming the organic layer 14. It is preferable that the lyophilic region 13AR extend in the bead formation region 4A. In this manner, wettability of the bead formation region 4A is improved, and beads are easily formed.

The lyophilic layer 13A which forms the lyophilic region 13AR is provided in the entire region of the pixel region 3 except for a light emitting region of the organic EL element 10. It is preferable that the lyophilic layer 13A is also provided in the bead formation region 4A, in the peripheral region 4. The lyophilic layer 13A covers a top face and a side face of the planarization film 28 and the anode electrode 12. An opening for exposing the top face of the anode electrode 12 is provided in the lyophilic layer 13A, and a light emitting region of the organic EL element 10 is defined by the opening of the lyophilic layer 13A. As a constituent material of the lyophilic layer 13A, for example, there is silicon oxide ($SiO_2$), silicon nitride ($Si_3N_4$), and the like.

The liquid repellent layer 13B which configures the liquid repellent region 13BR is provided on the lyophilic layer 13A, and covers a part of region on the lyophilic layer 13A. In the lyophilic layer 13A, the surface of the lyophilic layer 13A is exposed in a region which is close to the opening (light emitting region of organic EL element 10). The liquid repellent layer 13B which is provided between the lyophilic layer 13A and the cathode electrode 15 takes on a role of securing insulation between the anode electrode 12 and the cathode electrode 15. As a constituent material of the liquid repellent layer 13B, for example, there is an organic material such as polyimide and novolac. The liquid repellent layer 13B with a liquid repellent property is formed by performing, for example, a plasma process with respect to the organic material. The liquid repellent layer 13B may be configured using a material containing fluorine.

Application Example

Subsequently, an application example of the display device which is related to the above described first and second embodiments, and the modification examples will be described with reference to FIGS. 25 to 39. The display device according to the above described embodiments (display devices 1, 1A, 1B, 1C, 1D, 1E, 1F, and 30) are applied to every type of electronic apparatus such as a television, a digital camera, a notebook-type personal computer, a mobile terminal device such as a mobile phone or a smart phone, or a video camera. In other words, the display device is applied to every electronic apparatus displaying an image signal which is input from the outside, or which is generated inside as an image or video.

Module

Figure 25:
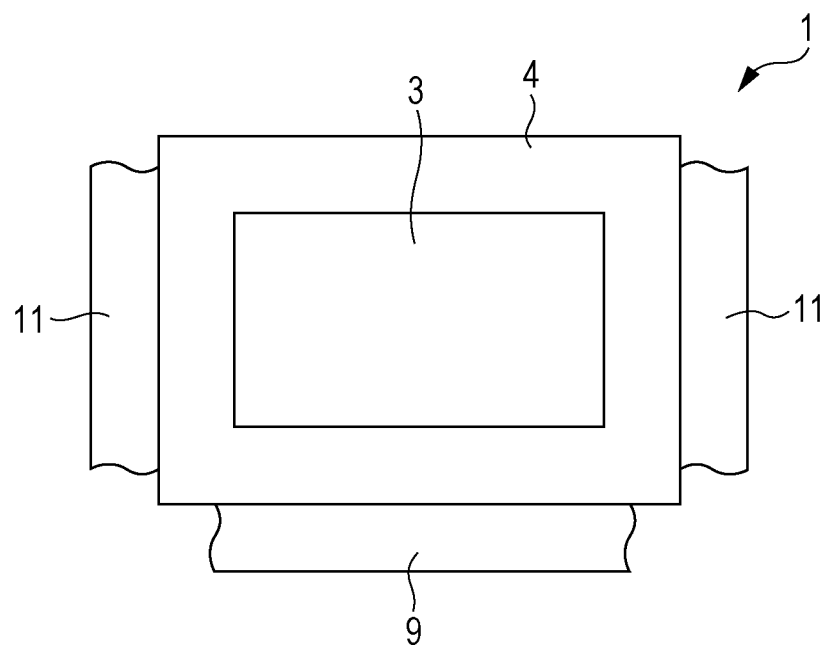

The display device in the above described embodiment, and the like, is incorporated in various electronic apparatuses such as application examples 1 to 9, which will be described later, as a module which is illustrated in FIG. 25. The module forms a terminal for an external connection (terminal 7 in FIG. 1, for example) by extending wiring to the peripheral region 4 at the periphery of the pixel region 3 of the substrate 2, for example. A flexible printed circuit (FPC) 9 for an input-output of a signal may be connected to the terminal.

Application Example 1

Figure 26:
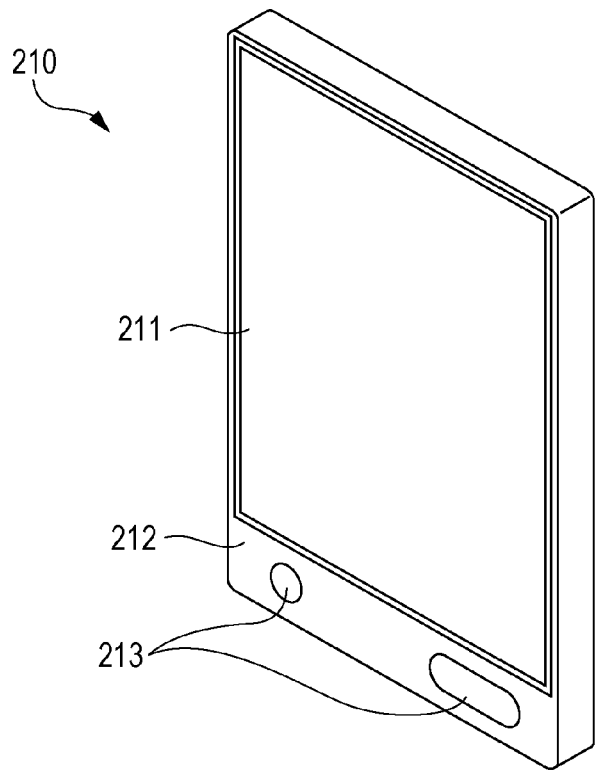
FIG. 26 is a perspective view which illustrates an appearance of an application example 1.
Figure 27:
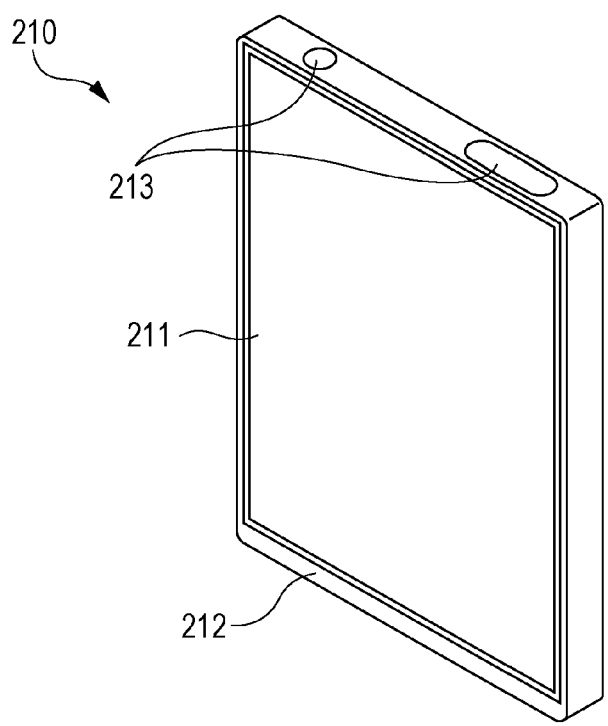
FIG. 27 is another perspective view which illustrates the appearance of the application example 1.

FIGS. 26 and 27 illustrate an external configuration of an electronic book 210. The electronic book 210 includes, for example, a display unit 211, a non-display unit 212, and an operation unit 213. In addition, the operation unit 213 may be provided on the front face of the non-display unit 212 as illustrated in FIG. 26, or may be provided on a top face of the non-display unit 212 as illustrated in FIG. 27. The display unit 211 is configured using the display device in the above described embodiment, and the like. In addition, the display device in the above described embodiment, and the like, may be mounted on a personal digital assistant (PDA) which has the same configuration as that in the electronic book illustrated in FIGS. 26 and 27.

Application Example 2

Figure 28:
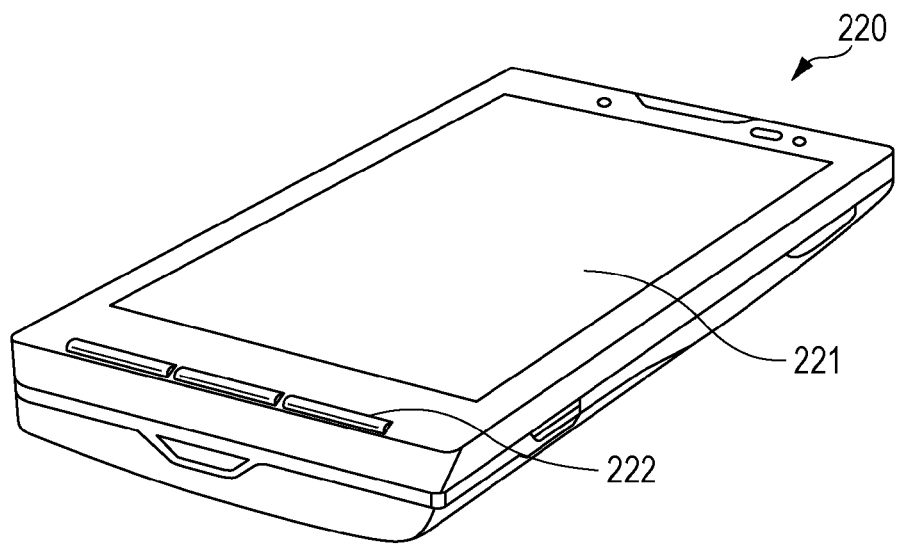
FIG. 28 is a perspective view which illustrates an appearance of the application example 2 which is viewed from the front side.
Figure 29:
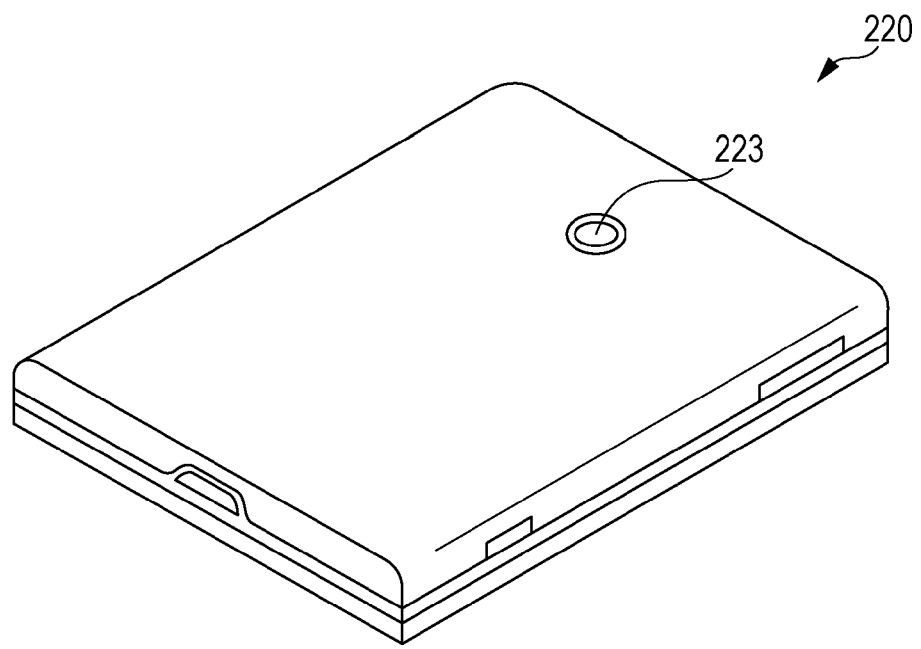
FIG. 29 is a perspective view which illustrates the appearance of the application example 2 which is viewed from the back side.

FIGS. 28 and 29 illustrate an appearance of a smart phone 220. The smart phone 220 includes a display unit 221 and an operation unit 222 on the front side, for example, and includes a camera 223 on the rear side, and the display unit 221 is configured of the display device in the above described embodiment, and the like.

Application Example 3

Figure 30:
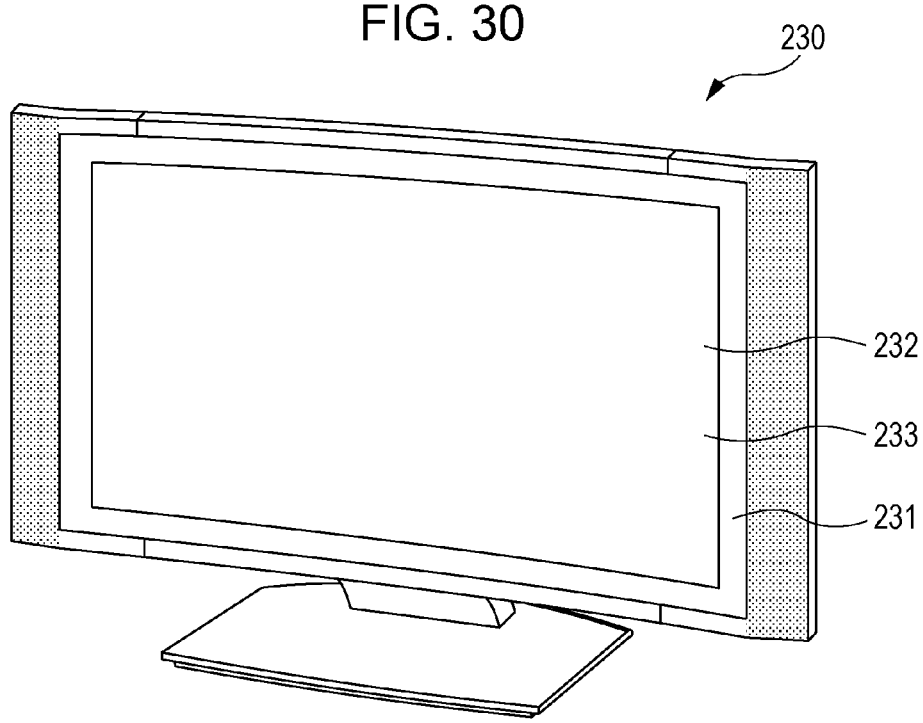
FIG. 30 is a perspective view which illustrates an appearance of an application example 3.

FIG. 30 illustrates an appearance of a television 230 to which the display device in the above described embodiment, and the like, is applied. The television 230 includes, for example, an image display screen 233 which includes a front panel 231 and a filter glass 232. The image display screen 233 is configured of the display device in the above described embodiment, and the like.

Application Example 4

Figure 31:
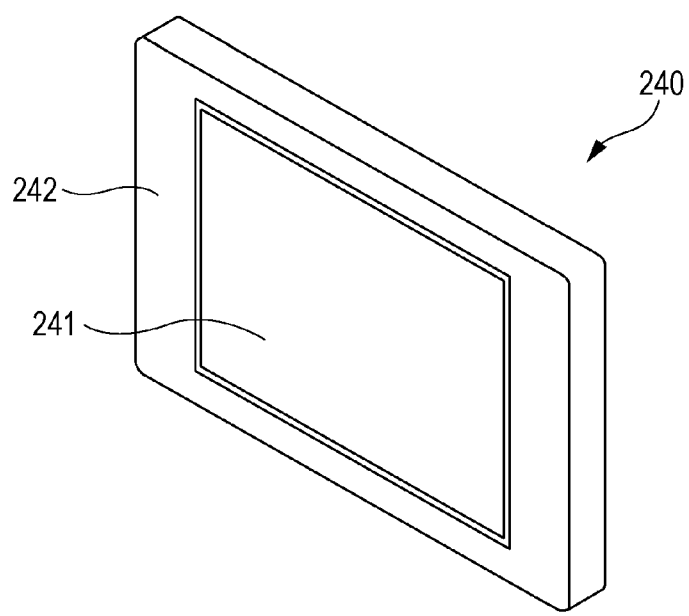
FIG. 31 is a perspective view which illustrates an appearance of an application example 4.

FIG. 31 illustrates an appearance of a tablet personal computer 240. The tablet personal computer 240 includes, for example, a touch panel 241 and a housing 242, and the touch panel 241 is configured of the display device in the above described embodiment, and the like.

Application Example 5

Figure 32:
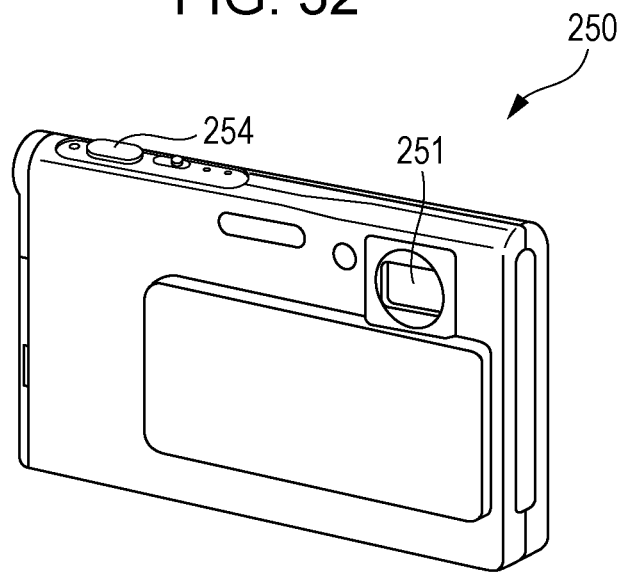
FIG. 32 is a perspective view which illustrates an appearance of an application example 5 which is viewed from the front side.
Figure 33:
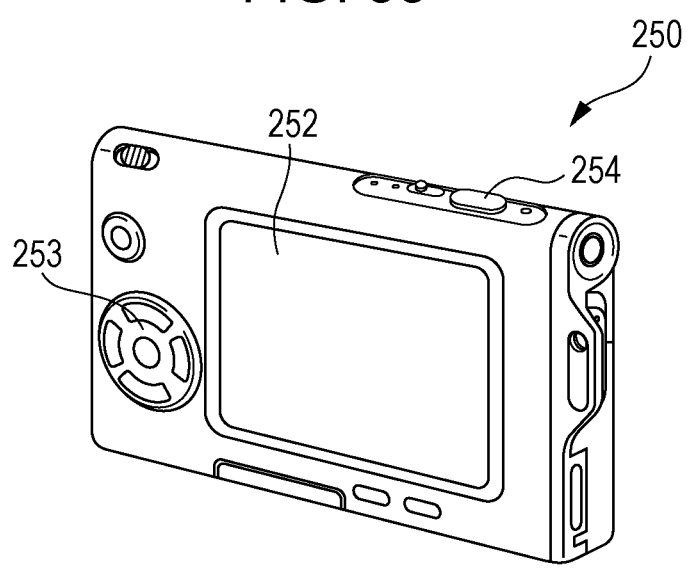
FIG. 33 is a perspective view which illustrates the appearance of the application example 5 which is viewed from the back side.

FIGS. 32 and 33 illustrate an appearance of a digital still camera 250. The digital still camera 250 includes, for example, a light emitting unit 251 for a flash, a display unit 252, a menu switch 253, and a shutter button 254, and the display unit 252 is configured of the display device in the above described embodiment, and the like.

Application Example 6

Figure 34:
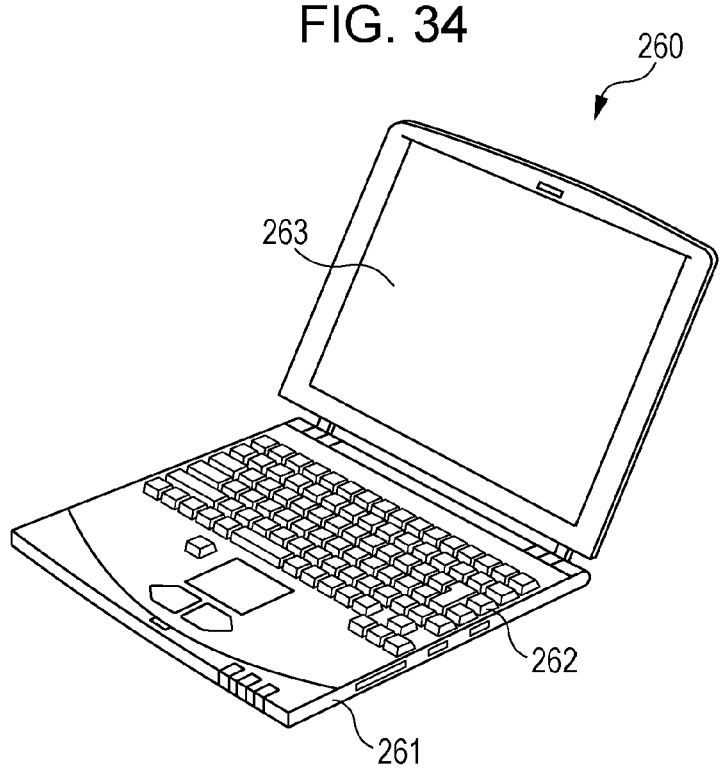
FIG. 34 is a perspective view which illustrates an appearance of an application example 6.

FIG. 34 illustrates an appearance of a notebook-type personal computer 260. The notebook-type personal computer 260 includes, for example, a main body 261, a keyboard 262 for an input operation of characters, or the like, and a display unit 263 for displaying an image, and the display unit 263 is configured of the display device in the above described embodiment, and the like.

Application Example 7

Figure 35:
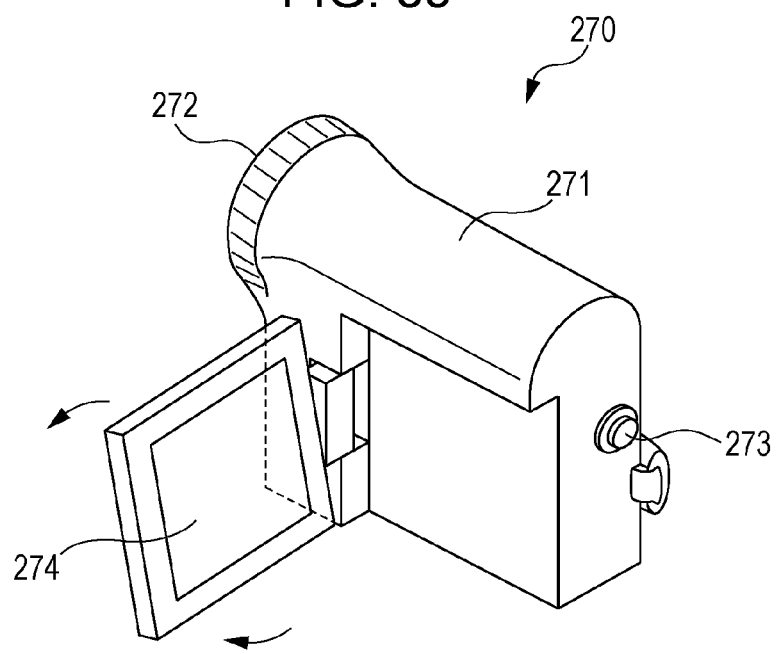
FIG. 35 is a perspective view which illustrates an appearance of an application example 7.

FIG. 35 illustrates an appearance of a video camera 270. The video camera 270 includes, for example, a main body 271, a lens 272 for photographing an object which is provided on a front side face of the main body 271, a start-stop switch 273 which is used when performing photographing, and a display unit 274. The display unit 274 is configured of the display device in the above described embodiment, and the like.

Application Example 8

Figure 36:
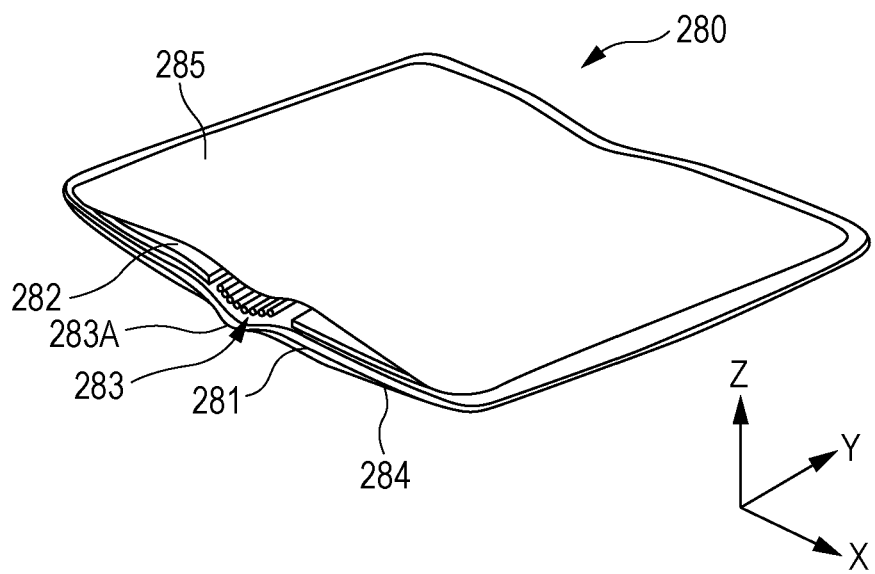
FIG. 36 is a perspective view which illustrates an open state of an application example 8.
Figure 37:
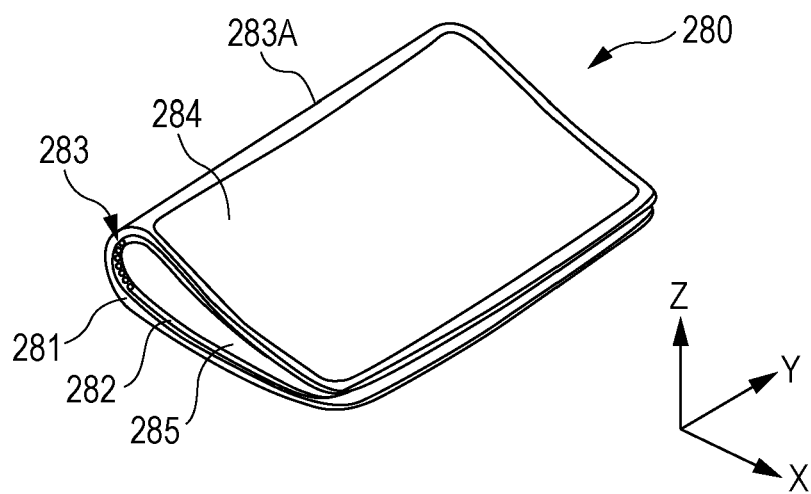
FIG. 37 is a perspective view which illustrates a closed state of the application example 8.

FIGS. 36 and 37 illustrate an appearance of another electronic book 280. The electronic book 280 is a thin flexible display in which a flexible material is formed as a component. In the electronic book 280, it is possible to close (fold) or open the whole device as if it were a real book which is made by binding a plurality of sheets (pages). It is possible for a user to read content (for example, a page of a book, or the like) which is displayed in the electronic book 280 with a feeling of actually reading a book.

The electronic book 280 includes a display unit 282 on a support board 281, and the "rear" portion (rear portion 283A) in the book includes a hinge unit 283. A cover 284 which is formed of a soft resin film is provided on a lower face (face which becomes the outside when being closed) side of the electronic book 280, and the top face (face which becomes the inside when being closed) side is covered with a protective sheet 285 formed of a resin film which is soft, and transparent with respect to display light. The display unit 282 is configured of the display device in the above described embodiment, and the like.

Application Example 9

Figure 38:
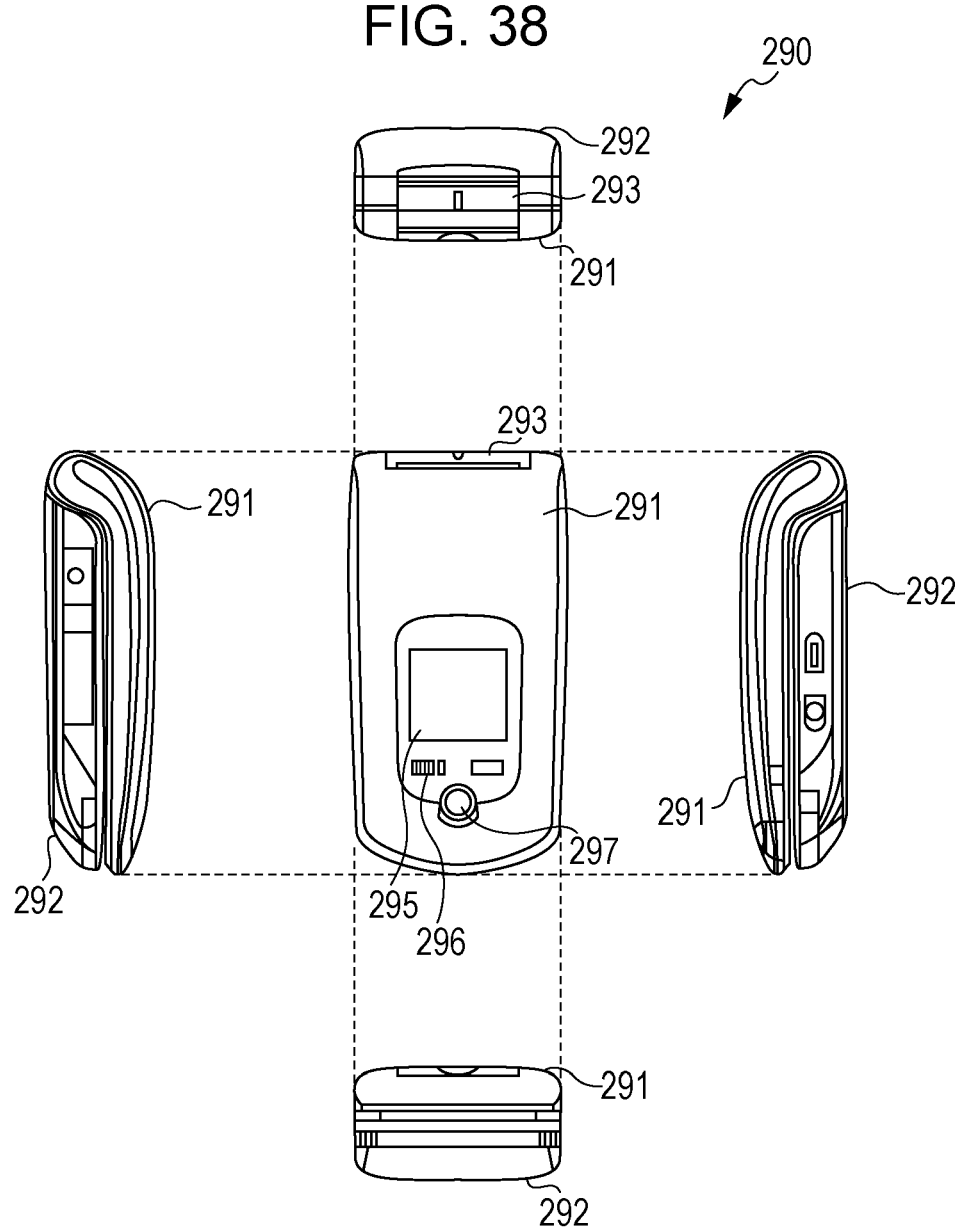
FIG. 38 is a diagram which illustrates a closed state of an application example 9.
Figure 39:
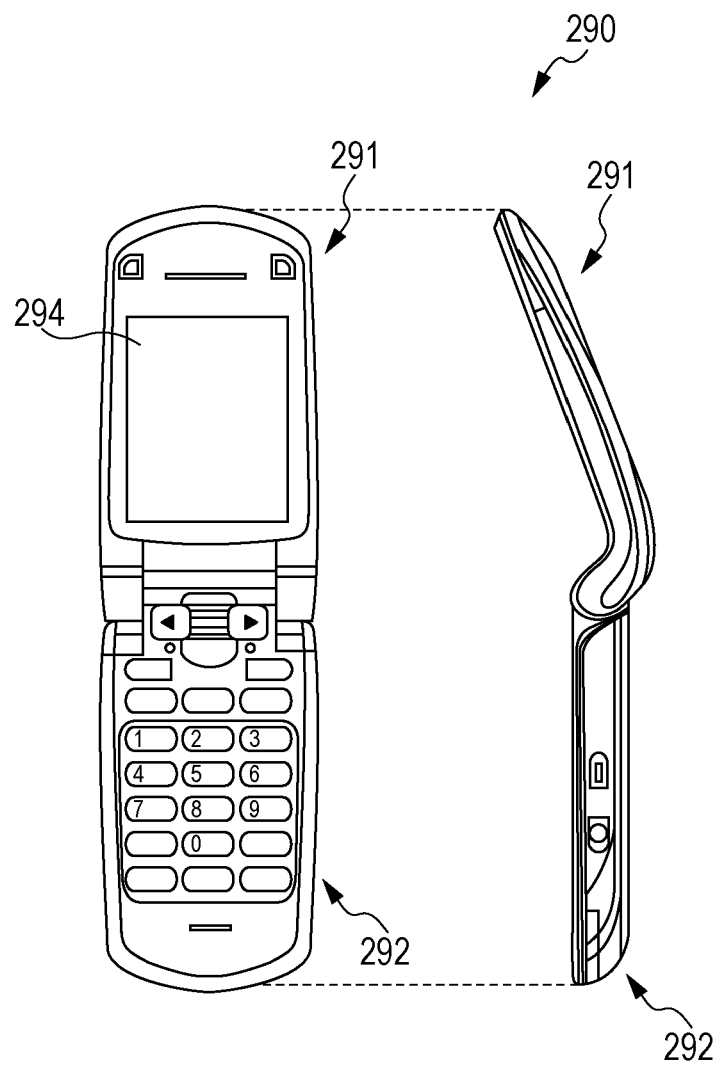
FIG. 39 is a diagram which illustrates an open state of the application example 9.

FIGS. 38 and 39 illustrate an appearance of a mobile phone 290. The mobile phone 290 is formed by connecting a higher housing 291 and a lower housing 292 using a connection unit (hinge unit) 293, for example, and includes a display 294, a sub-display 295, a picture light 296, and a camera 297. The display 294, or the sub-display 295 is configured of the display device in the above described embodiment, and the like.

Hitherto, the present technology has been described using embodiments and modification examples; however, the present technology is not limited to the embodiments, and various modifications are possible.

For example, in the embodiments, configurations of the display devices 1, 1A to 1F, and 30 are specifically described; however, the display devices 1, 1A to 1F, and 30 are not limited so as to include all of the illustrated constituent elements. In addition, it is also possible to replace a part of constituent elements with another constituent element.

In addition, a material and thickness, or a film forming method and condition, and the like, of each layer which is described in the above described embodiments are not limited, and may be another material and thickness, or another film forming method and condition. For example, in the above described embodiments, an oxide semiconductor is used as a channel in the TFT 20; however, there is no limitation to this, and silicon, an organic semiconductor, or the like, may be used. It is also possible to use a dry process and a wet process together according to constituent materials of each unit.

In addition, in the above described embodiment, and the like, a case in which the organic layer 14 other than the light emitting layer 14C is formed using the vacuum deposition method has been described; however, the organic layer 14 other than the light emitting layer 14C may be formed using a printing method. As the printing method, a letterpress printing method, an intaglio printing method, a screen printing method, and a microgravure coating method may be used, in addition to the ink jet printing method, the stripe printing method, the slit printing method, and the nozzle printing method, and the organic layer 14 may be formed using an application method such as a spin coating method, a dipping method, a doctor blade method, an ejection coating method, and a spray coating method. The organic layer 14 other than the light emitting layer 14C may be formed in each pixel 5.

In addition, the effect which is described in the specification is merely an example, there is no limitation to this, and there may be another effect.

In addition, the present technology also has the following configurations.

(1) A display device which includes a first substrate including an organic layer forming region, and an organic layer non-forming region which is provided on an outer side of the organic layer forming region, and a first partitioning wall which is provided between the organic layer forming region and the organic layer non-forming region on the first substrate.

(2) The display device which is described in (1), in which a terminal for an external connection is provided in the organic layer non-forming region.

(3) The display device which is described in (1) further including a second substrate which faces the first substrate, and in which a sealing agent is provided between the second substrate and the first substrate in the organic layer non-forming region.

(4) The display device which is described in (1), in which a first electrode and a second electrode are provided in the organic layer forming region on the first substrate, and the second electrode is electrically connected to wiring which is provided in the organic layer non-forming region on the first substrate.

(5) The display device which is described in (4), in which an organic layer including a light emitting layer is provided between the first electrode and the second electrode.

(6) The display device which is described in any one of (1) to (5) further including a second partitioning wall on an outer side of the organic layer forming region on the first substrate, in which the organic layer non-forming region is provided between the first partitioning wall and the second partitioning wall.

(7) The display device which is described in any one of (1) to (6) in which a plurality of the organic layer non-forming regions and a plurality of the first partitioning walls are provided on the first substrate, and at least a part of the plurality of first partitioning walls is provided between the neighboring organic layer non-forming regions.

(8) The display device which is described in any one of (1) to (7), in which the first partitioning wall is configured of an organic material.

(9) The display device which is described in any one of (1) to (8), in which the organic layer forming region is a pixel region which includes a plurality of pixels which are arranged in a matrix.

(10) The display device which is described in (9) includes an insulation film between pixels in the organic layer forming region on the substrate, in which the insulation film between pixels contains the same constituent material as that of the first partitioning wall.

(11) The display device which is described in (9) or (10) further including a liquid repellent region in a region between columns of the plurality of pixels.

(12) An electronic apparatus including a display device, in which the display device includes a first substrate including an organic layer forming region, and an organic layer non-forming region which is provided on an outer side of the organic layer forming region, and a first partitioning wall which is provided between the organic layer forming region and the organic layer non-forming region on the first substrate.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   a first substrate including an organic layer forming region, and an organic layer non-forming region which is provided on an outer side of the organic layer forming region;
   a first partitioning wall which is provided between the organic layer forming region and the organic layer non-forming region the first substrate;
   a second substrate which faces the first substrate; and
   a sealing agent is provided between the second substrate and the first substrate in the organic layer non-forming region,
   wherein the first partitioning wall does not directly contact the first substrate and the second substrate.

2. The display device according to claim 1, wherein a terminal for an external connection is provided in the organic layer non-forming region.

3. The display device according to claim 1, wherein a first electrode and a second electrode are provided in the organic layer forming region on the first substrate, and wherein the second electrode is electrically connected to wiring which is provided in the organic layer non-forming region on the first substrate.

4. The display device according to claim 3, wherein an organic layer including a light emitting layer is provided between the first electrode and the second electrode.

5. The display device according to claim 1, further comprising: a second partitioning wall on an outer side of the organic layer forming region on the first substrate, wherein the organic layer non-forming region is provided between the first partitioning wall and the second partitioning wall.

6. The display device according to claim 1, wherein a plurality of the organic layer non-forming regions and a plurality of the first partitioning walls are provided on the first substrate, and wherein at least a part of the plurality of first partitioning walls is provided between the neighboring organic layer non-forming regions.

7. The display device according to claim 1, wherein the first partitioning wall is configured of an organic material.

8. The display device according to claim 1, wherein the organic layer forming region is a pixel region which includes a plurality of pixels which are arranged in a matrix.

9. The display device according to claim 8, further comprising: an insulation film between pixels in the organic layer forming region on the substrate, wherein the insulation film between pixels contains the same constituent material as that of the first partitioning wall.

10. The display device according to claim 8, further comprising: a liquid repellent region in a region between columns of the plurality of pixels.

11. The display device according to claim 1, wherein the first partitioning wall has a height in a Z-direction between five hundred nanometers and four thousand nanometers and a width in an X-direction between five micrometers and one hundred micrometers.

12. An electronic apparatus comprising:
   a display device,
   wherein the display device includes
      a first substrate including an organic layer forming region, and an organic layer non-forming region which is provided on an outer side of the organic layer forming region;
      a first partitioning wall which is provided between the organic layer forming region and the organic layer non-forming region on the first substrate;
      a second substrate which faces the first substrate; and
      a sealing agent is provided between the second substrate and the first substrate in the organic layer non-forming region,
      wherein the first partitioning wall does not directly contact the first substrate and the second substrate.

13. The electronic apparatus according to claim 12, wherein a terminal for an external connection is provided in the organic layer non-forming region.

14. The electronic apparatus according to claim 12, wherein a first electrode and a second electrode are provided in the organic layer forming region on the first substrate, and wherein the second electrode is electrically connected to wiring which is provided in the organic layer non-forming region on the first substrate.

15. The electronic apparatus according to claim 14, wherein an organic layer including a light emitting layer is provided between the first electrode and the second electrode.

16. The electronic apparatus according to claim 12, wherein the display device further includes a second partitioning wall on an outer side of the organic layer forming region on the first substrate, wherein the organic layer non-forming region is provided between the first partitioning wall and the second partitioning wall.

17. The electronic apparatus according to claim 12, wherein a plurality of the organic layer non-forming regions and a plurality of the first partitioning walls are provided on the first substrate, and wherein at least a part of the plurality of first partitioning walls is provided between the neighboring organic layer non-forming regions.

18. The electronic apparatus according to claim 12, wherein the first partitioning wall is configured of an organic material.

19. The electronic apparatus according to claim 12, wherein the organic layer forming region is a pixel region which includes a plurality of pixels which are arranged in a matrix.

20. The electronic apparatus according to claim 12, wherein the display device further includes an insulation film between pixels in the organic layer forming region on the substrate, wherein the insulation film between pixels contains the same constituent material as that of the first partitioning wall.

21. The electronic apparatus according to claim 12, wherein the display device further includes a liquid repellent region in a region between columns of the plurality of pixels.

22. The electronic apparatus according to claim 12, wherein the first partitioning wall has a height in a Z-direction between five hundred nanometers and four thousand nanometers and a width in an X-direction between five micrometers and one hundred micrometers.

* * * * *